(12) United States Patent
Di Sarro et al.

(10) Patent No.: US 8,610,249 B2
(45) Date of Patent: Dec. 17, 2013

(54) NON-PLANAR CAPACITOR AND METHOD OF FORMING THE NON-PLANAR CAPACITOR

(75) Inventors: James P. Di Sarro, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/434,964

(22) Filed: Mar. 30, 2012

(65) Prior Publication Data
US 2013/0256835 A1    Oct. 3, 2013

(51) Int. Cl.
*H01L 21/02* (2006.01)
(52) U.S. Cl.
USPC .... 257/532; 257/534; 257/300; 257/E27.084; 257/E27.097; 438/398; 438/239; 438/251; 438/255
(58) Field of Classification Search
USPC .......... 257/532, 534, 300, E27.084, E27.097; 438/398, 239, 251, 255
See application file for complete search history.

(56) References Cited

U.S. PATENT DOCUMENTS

| | | |
|---|---|---|
| 4,419,812 A * | 12/1983 | Topich .......................... 438/238 |
| 5,206,787 A | 4/1993 | Fujioka |
| 5,352,923 A | 10/1994 | Boyd et al. |
| 5,688,709 A | 11/1997 | Rostoker |
| 5,851,897 A | 12/1998 | Wu |
| 6,027,967 A | 2/2000 | Parekh et al. |
| 6,081,008 A | 6/2000 | Rostoker |
| 6,083,790 A | 7/2000 | Lin et al. |
| 6,100,129 A | 8/2000 | Tu et al. |
| 6,204,141 B1 | 3/2001 | Lou |
| 6,552,383 B2 | 4/2003 | Ahn et al. |
| 6,624,018 B1 | 9/2003 | Yu et al. |
| 6,664,582 B2 | 12/2003 | Fried et al. |
| 6,812,109 B2 | 11/2004 | Ahn et al. |
| 6,947,275 B1 | 9/2005 | Anderson et al. |
| 6,977,404 B2 | 12/2005 | Katsumata et al. |
| 6,998,676 B2 | 2/2006 | Kondo et al. |
| 7,060,553 B2 | 6/2006 | Fried et al. |
| 7,291,533 B2 | 11/2007 | von Schwerin |

(Continued)

OTHER PUBLICATIONS

U.S. Appl. No. 13/359,615, filed Jan. 27, 2012.

*Primary Examiner* — Tu-Tu Ho
(74) *Attorney, Agent, or Firm* — Gibb & Riley, LLC; Michael J. LeStrange, Esq.

(57) ABSTRACT

Disclosed herein are embodiments of non-planar capacitor. The non-planar capacitor can comprise a plurality of fins above a semiconductor substrate. Each fin can comprise at least an insulator section on the semiconductor substrate and a semiconductor section, which has essentially uniform conductivity, stacked above the insulator section. A gate structure can traverse the center portions of the fins. This gate structure can comprise a conformal dielectric layer and a conductor layer (e.g., a blanket or conformal conductor layer) on the dielectric layer. Such a non-planar capacitor can exhibit a first capacitance, which is optionally tunable, between the conductor layer and the fins and a second capacitance between the conductor layer and the semiconductor substrate. Also disclosed herein are method embodiments, which can be used to form such a non-planar capacitor and which are compatible with current state of the art multi-gate non-planar field effect transistor (MUGFET) processing.

19 Claims, 17 Drawing Sheets

(56) References Cited

U.S. PATENT DOCUMENTS

| | | |
|---|---|---|
| 7,312,492 B2 | 12/2007 | Gruning-Von Schwerin |
| 7,851,283 B2 | 12/2010 | Anderson et al. |
| 7,888,750 B2 | 2/2011 | Anderson et al. |
| 2001/0031531 A1 | 10/2001 | Liaw |
| 2004/0150071 A1 | 8/2004 | Kondo et al. |
| 2007/0158725 A1 | 7/2007 | Cheng et al. |
| 2008/0108199 A1 | 5/2008 | Schwerin |
| 2009/0242952 A1* | 10/2009 | Heinrichsdorff et al. ..... 257/300 |

* cited by examiner

US 8,610,249 B2

NON-PLANAR CAPACITOR AND METHOD OF FORMING THE NON-PLANAR CAPACITOR

BACKGROUND

1. Field of the Invention

The embodiments disclosed herein relate to capacitors and, more specifically, to a non-planar capacitor structure and to a method of forming the non-planar capacitor.

2. Description of the Related Art

Integrated circuit design decisions are often driven by device scalability and manufacturing efficiency. For example, size scaling of a single-gate planar field effect transistor resulted in a smaller channel length and, unfortunately, the smaller channel length resulted in a corresponding increase in short channel effects and a decrease in drive current. In response, different types of multi-gate non-planar field effect transistors (MUGFETs), such as dual-gate non-planar FETs (also referred to herein as fin-type FETs (FINFETs)) and tri-gate non-planar FETs, were developed in order to provide reduced-size field effect transistors, while simultaneously avoiding corresponding increases in short channel effects and decreases in drive current. Unfortunately, the processes currently used to form the passive devices and, particularly, the capacitors required for many circuit designs are not readily integrated into the processes used to form such MUGFETs. Therefore, there is a need in the art for a capacitor structure that can be formed using processing techniques that are compatible with current state of the art MUGFET processing techniques.

SUMMARY

In view of the foregoing, disclosed herein are embodiments of a non-planar capacitor. This non-planar capacitor can comprise a plurality of fins above a semiconductor substrate. Each fin can comprise at least an insulator section on the semiconductor substrate and a semiconductor section, which has essentially uniform conductivity, stacked above the insulator section. A gate structure can traverse the center portions of the fins. This gate structure can comprise a conformal dielectric layer and a conductor layer (e.g., a blanket or conformal conductor layer) on the dielectric layer. Such a non-planar capacitor can exhibit a first capacitance, which is optionally tunable, between the conductor layer and the fins and a second capacitance between the conductor layer and the semiconductor substrate. Also disclosed herein are method embodiments, which can be used to form such a non-planar capacitor and which are compatible with current state of the art multi-gate non-planar field effect transistor (MUGFET) processing.

More particularly, disclosed herein are embodiments of a non-planar capacitor. This non-planar capacitor can comprise a plurality of fins above a semiconductor substrate. Each of the fins can comprise at least an insulator section on a top surface of the semiconductor substrate and a semiconductor section stacked above the insulator section. Optionally, each of the fins can also comprise a dielectric cap layer and/or a portion of the semiconductor substrate below the insulator layer. The semiconductor section of each of the fins can have essentially uniform conductivity. That is, the semiconductor section of each fin can, across the length of the fin, have the same conductivity type (e.g., N-type or P-type) and approximately the same conductivity level.

Additionally, a gate structure can traverse the center portions of the fins. This gate structure can comprise a conformal dielectric layer and a conductor layer (e.g., a blanket or conformal metal layer) positioned on the conformal dielectric layer. Specifically, the conformal dielectric layer can traverse the center portions of the fins and, particularly, can cover the top surface and opposing sidewalls of the center portions of the fins as well as the top surface of the semiconductor substrate adjacent to and between the center portions of adjacent fins. The conductor layer can be positioned on the dielectric layer such that it similarly traverses the center portions of the fins and, more particularly, such that it is on the dielectric layer opposite the top surface and opposing sidewalls of the center portion of each fin and such that it is also on the dielectric layer opposite the top surface of the semiconductor substrate adjacent to and between the center portions of adjacent fins. This gate structure can be patterned such that the end portions of the fins extend laterally beyond the gate structure.

In one embodiment, the fins can be electrically isolated from each other. Contacts can extend to the conductor layer, to the end portions of the fins on one or both sides of the gate structure, and to the semiconductor substrate. Thus, in this embodiment, the non-planar capacitor can exhibit a first capacitance between the conductor layer, which functions as a first conductive plate, and the fins (or, more particularly, the semiconductor sections thereof), which function as second conductive plates, and can further exhibit a second capacitance between the conductor layer and the semiconductor substrate, which functions as a third conductive plate. Optionally, a multiplexor connected to the contacts can allow any one or more of the semiconductor sections of the fins to be biased at a given time so that the first capacitance is tunable (i.e., can be selectively tuned or varied).

In other embodiments, the non-planar capacitor can comprise contact region(s) that electrically connect the end portions of the fins on one or both sides of the gate structure. In this case, contacts can be connected to the conductor layer, to the contact region(s), and to the semiconductor substrate. Thus, in these embodiments, the non-planar capacitor can exhibit a first capacitance between the conductor layer, which functions as a first conductive plate, and the fins (or, more particularly, the semiconductor sections thereof), which in combination function as a second conductive plate, and a second capacitance between the conductor layer and the semiconductor substrate, which functions as a third conductive plate.

Also disclosed herein are method embodiments, which can be used to form such a non-planar capacitor and which are compatible with current state of the art multi-gate non-planar field effect transistor (MUGFET) processing.

Specifically, an embodiment of a method for forming a non-planar capacitor can comprise forming a plurality of fins above a semiconductor substrate. The fins can be formed (e.g., patterned and etched) such that each of the fins comprises at least an insulator section on a top surface of the semiconductor substrate and a semiconductor section above the insulator section. Optionally, the fins can be formed (e.g., patterned and etched) such that they each also comprise a dielectric cap layer and/or a portion of the semiconductor substrate below the insulator layer.

Either before or after the fins are formed, a doping process can be performed in order to ensure that the semiconductor section of each of the fins has essentially uniform conductivity. That is, a doping process can be performed such that the semiconductor section of each fin has the same conductivity type (e.g., N-type or P-type) and approximately the same conductivity level across the length of the fin.

After the fins are formed, a conformal dielectric layer can be formed over the fins and a conductor layer (e.g., a blanket or conformal conductor layer) can be formed over the dielectric layer. Subsequently, the dielectric layer-conductor layer stack can be lithographically patterned and etched to form a gate structure and to exposed end portions of the fins that extend laterally beyond the gate structure.

Next, one or more additional dielectric layers (i.e., interlayer dielectric materials) can be deposited and contacts can be formed that extend vertically through the additional dielectric layers to the conductor layer, to the end portions of the fins (or, more particularly, to the semiconductor sections thereof), and to the semiconductor substrate. Thus, in this embodiment, the non-planar capacitor can exhibit a first capacitance between the conductor layer, which functions as a first conductive plate, and the fins (or, more particularly, the semiconductor sections thereof), which function as second conductive plates, and can further exhibit a second capacitance between the conductor layer and the semiconductor substrate, which functions as a third conductive plate. Optionally, a multiplexor can be electrically connected between a voltage source and the contacts to the end portions of the fins so as to allow any one or more of the semiconductor sections of the fins to be biased at a given time and, thereby so that the first capacitance can be selectively tuned or varied.

Alternatively, after the end portions of the fins are exposed, contact region(s) can be formed to electrically connect the end portions of the fins on one or both sides of the gate structure. Then, one or more additional dielectric layers (i.e., interlayer dielectric materials) can be deposited and contacts can be formed that extend vertically through the additional dielectric layers to the conductor layer, to the contact region(s), and to the semiconductor substrate. Thus, in this embodiment, the non-planar capacitor can exhibit a first capacitance between the conductor layer, which functions as a first conductive plate, and the fins (or, more particularly, the semiconductor sections thereof), which function in combination as a second conductive plate, and can further exhibit a second capacitance between the conductor layer and the semiconductor substrate, which functions as a third conductive plate.

Another embodiment of a method of forming a non-planar capacitor can comprise forming, above a semiconductor substrate, a structure comprising two parallel contact regions and a plurality of fins extending laterally between the contact regions. In this case, the structure can be formed (e.g., patterned and etched) such that the contact regions and the fins each comprise at least an insulator section on a top surface of the semiconductor substrate; and a semiconductor section above the insulator section. Optionally, the structure can be formed (e.g., patterned and etched) such that the contact regions and fins each also comprise a dielectric cap layer and/or a portion of the semiconductor substrate below the insulator layer.

Either before or after the structure is formed, a doping process can be performed in order to ensure that the semiconductor section of each of the fins and contact regions has essentially uniform conductivity. That is, a doping process can be performed such that the semiconductor section of each fin and each contact region has the same conductivity type (e.g., N-type or P-type) and approximately the same conductivity level across the entire structure.

After the structure is formed, a conformal dielectric layer can be formed over the structure (i.e., over the fins and contact regions) and a conductor layer (e.g., a blanket or conformal conductor layer) can be formed over the dielectric layer. Subsequently, the dielectric layer-conductor layer stack can be lithographically patterned and etched to form a gate structure and to expose the contact regions.

Then, one or more additional dielectric layers (i.e., interlayer dielectric materials) can be deposited and contacts can be formed that extend vertically through the additional dielectric layers to the conductor layer, to the contact regions, and to the semiconductor substrate. Thus, in this embodiment, the non-planar capacitor can exhibit a first capacitance between the conductor layer, which functions as a first conductive plate, and the fins (or, more particularly, the semiconductor sections thereof), which function in combination as a second conductive plate, and can further exhibit a second capacitance between the conductor layer and the semiconductor substrate, which functions as a third conductive plate.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
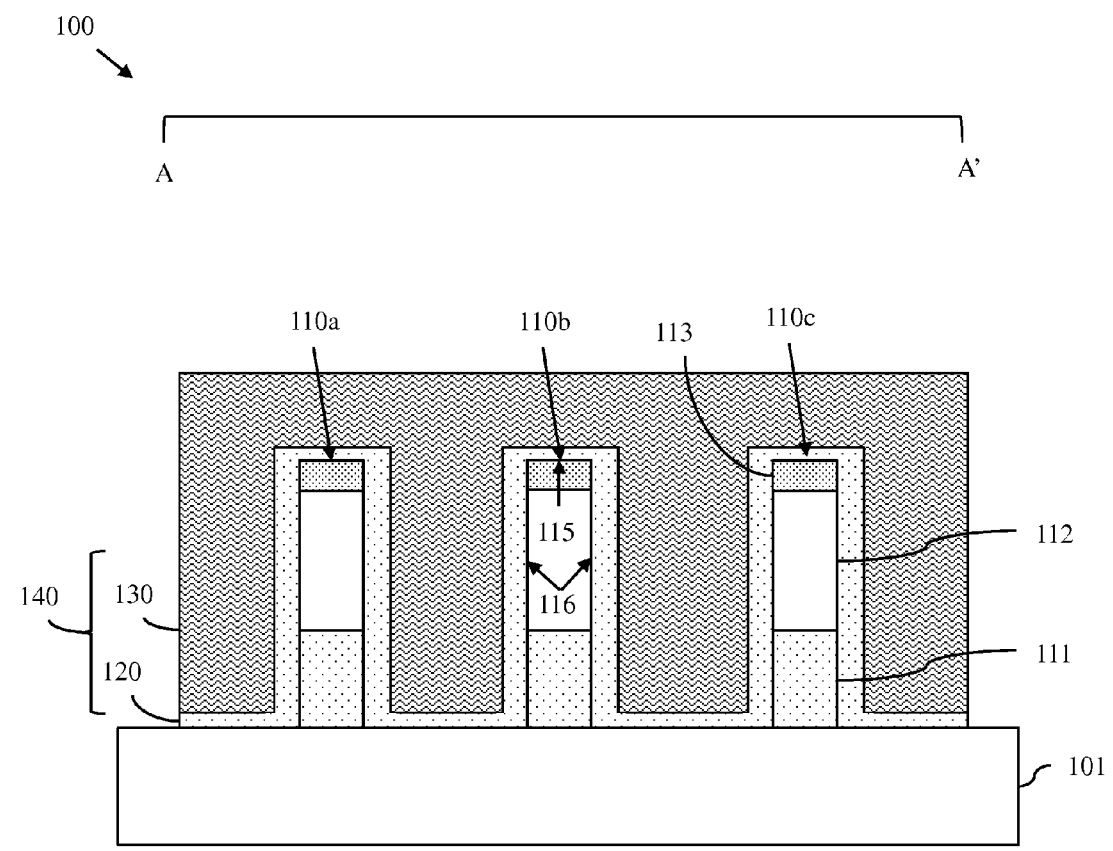
FIG. 1 is drawing illustrating a cross-section of an embodiment of a non-planar capacitor with a blanket conductor layer.

As mentioned above, integrated circuit design decisions are often driven by device scalability and manufacturing efficiency. For example, size scaling of a single-gate planar field effect transistor resulted in a smaller channel length and, unfortunately, the smaller channel length resulted in a corresponding increase in short channel effects and a decrease in drive current. In response, different types of multi-gate non-planar field effect transistors (MUGFETs), such as dual-gate non-planar FETs (also referred to herein as fin-type FETs (FINFETs)) and tri-gate non-planar FETs, were developed in order to provide reduced-size field effect transistors, while simultaneously avoiding corresponding increases in short channel effects and decreases in drive current.

Specifically, dual-gate non-planar FETs are non-planar FETs formed using a relatively thin semiconductor fin. For example, the semiconductor fin of a dual-gate non-planar FET can have a height to width ratio of 4:1 or greater. In such a FET, a fully depleted channel region is formed in the center portion of the thin semiconductor fin and source and drain regions are formed in the end portions of the semiconductor fin on opposing sides of the channel region. A gate is formed on the top surface and opposing sides of the semiconductor fin adjacent to the channel region. A dielectric cap (e.g., a nitride cap) is positioned on the top surface of the semiconductor fin (i.e., between the top surface of the fin and the gate) and ensures that the FET exhibits only two-dimensional field effects. Tri-gate non-planar FETs are similar in structure to the dual-gate non-planar FETS, described above, except that the semiconductor fin of a tri-gate non-planar FET is relatively wide. For example, the semiconductor fin of a tri-gate non-planar FET can have a height to width ratio ranging between 3:2 and 2:3. In this case, the top surface of the semiconductor fin is not isolated from the gate by a dielectric cap and, thus, the FET exhibits three-dimensional field effects. The three-dimensional field effects allow for full depletion of the channel region despite the relatively thick semiconductor fin. It should be noted that the effective channel width of any of the above-described MUGFETs (e.g., of dual-gate and tri-gate non-planar FETs) and, thereby the device drive current can further be increased by incorporating multiple semiconductor fins into the MUGFET structure. Unfortunately, the processes currently used to form the passive devices and, particularly, the capacitors required for many circuit designs are not readily integrated into the processes used to form such MUGFETs.

In view of the foregoing, disclosed herein are embodiments of a non-planar capacitor. This non-planar capacitor can comprise a plurality of fins above a semiconductor substrate. Each fin can comprise at least an insulator section on the semiconductor substrate and a semiconductor section, which has essentially uniform conductivity, stacked above the insulator section. A gate structure can traverse the center portions of the fins. The gate structure can comprise a conformal dielectric layer positioned on the fins and on the top surface of the semiconductor substrate between the fins and a conductor layer (e.g., a blanket or conformal conductor layer) position on the dielectric layer. Such a non-planar capacitor can exhibit a first capacitance, which is optionally tunable, between the conductor layer and the semiconductor sections of the fins and a second capacitance between the conductor layer and the semiconductor substrate. Also disclosed herein are method embodiments, which can be used to form such a non-planar capacitor and which are compatible with current state of the art multi-gate non-planar field effect transistor (MUGFET) processing.

Figure 2:
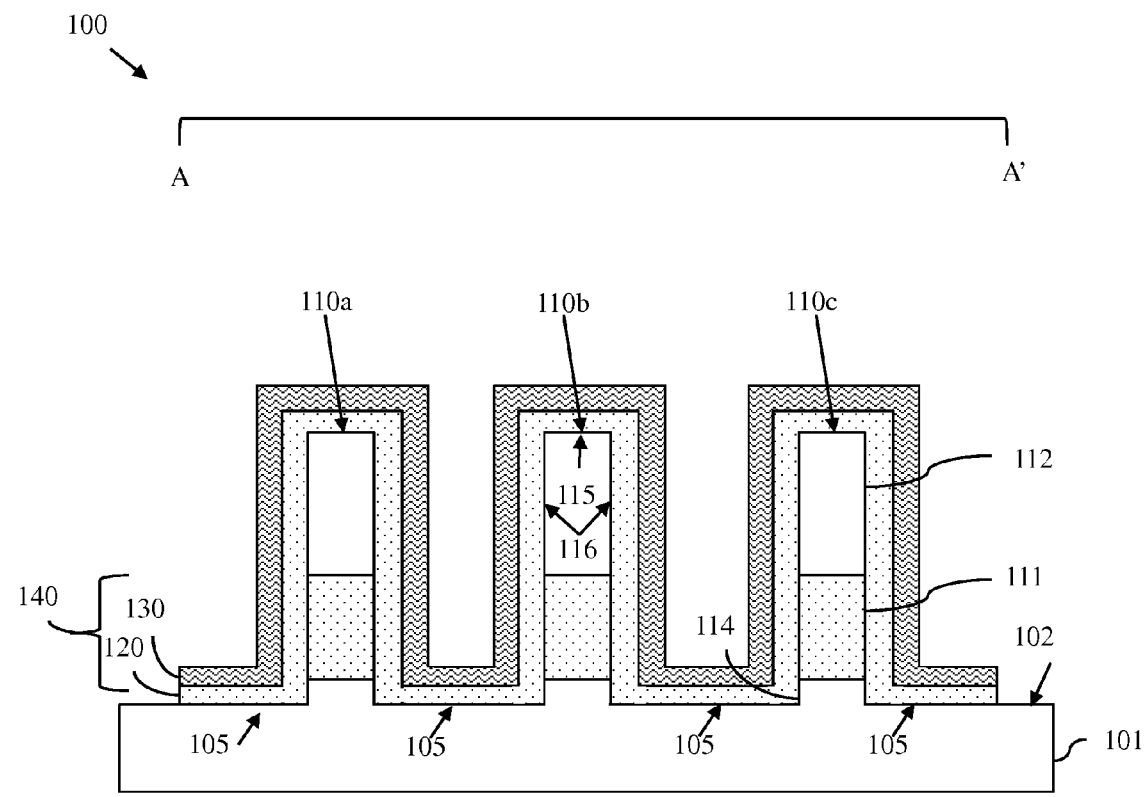
FIG. 2 is drawing illustrating a cross-section of an embodiment of a non-planar capacitor with a conformal conductor layer.

More particularly, FIGS. 1 and 2 are cross-section diagrams of embodiments of a non-planar capacitor 100, which can be formed with processing techniques that are compatible with current state of the art MUGFET processing. Specifically, in each of these embodiments, the non-planar capacitor 100 can be formed on a semiconductor-on-insulator (SOI) wafer, which can comprise, for example, a semiconductor substrate 101 (e.g., a silicon substrate or any other suitable semiconductor substrate); an insulator layer (e.g., a silicon dioxide ($SiO_2$) layer, a sapphire layer or any other suitable insulator layer) on the semiconductor substrate 101 and a semiconductor layer (e.g., a silicon layer, a gallium nitride layer, or any other suitable semiconductor layer) on the insulator layer.

In each of the embodiments, the non-planar capacitor 100 can comprise a plurality of essentially parallel fins 110a-c patterned and etched into the SOI wafer above the semiconductor substrate 101. For purposes of this disclosure, a fin refers to a relatively thin, vertically oriented, essentially rectangular, three-dimensional body. Additionally, for illustration purposes, the non-planar capacitor 100 is shown in FIGS. 1 and 2 as having three fins 110a-c; however, it should be understood that such a non-planar capacitor 100 can have any number of two or more fins. Each of these fins 110a-c can have a center portion 118 positioned laterally between end portions 117 and the end portions 117 of adjacent fins can be either electrically isolated from each other (see FIG. 3 and detailed discussion below) or electrically connected to each other (see FIGS. 4-5 and detailed discussion below).

Referring again to FIGS. 1 and 2, the fins 110a-c can be patterned and etched into the SOI wafer such that they each comprise at least an insulator section 111 (i.e., a section of the insulator layer of the SOI wafer) on the top surface 102 of the semiconductor substrate 101 and a semiconductor section 112 (i.e., a section of the semiconductor layer of the SOI wafer) stacked above the insulator section 111. The semiconductor section 112 of each fin 110a-c can have essentially uniform N-type or P-type conductivity. That is, the semiconductor section 112 of each fin 110a-c can be essentially uniformly doped with an N-type or P-type dopant so as to have essentially uniform conductivity in terms of both type and level across its length, width and height.

Those skilled in the art will recognize that different dopants can be used to achieve the desired conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having an N-type conductivity is typically doped with silicon (Si).

Optionally, as shown in FIG. 1, each of the fins 110a-c can further comprise a dielectric cap 113 (e.g., a silicon nitride cap, a silicon oxide cap, a silicon oxynitride cap or any other suitable dielectric cap) stacked above the semiconductor section 112. Specifically, as shown in FIG. 1 and discussed in greater detail below with regard to the method embodiments, if the non-planar capacitor processing is integrated with dual-gate non-planar FET processing and, more specifically, if the fins 110a-c for the non-planar capacitor are formed at the same time as fins for a dual-gate non-planar FET, dielectric caps 113 present on the fins 110a-c following formation (i.e., following fin etch) may be left intact on all fins because dual-gate non-planar FETs require such caps in order to limit the field effect so only two-dimensional field effects. However, as shown in FIG. 2 and discussed in greater detail below, if the non-planar capacitor processing is integrated with tri-gate non-planar FET processing and, more specifically, if the fins 110a-c for the non-planar capacitor are formed at the same time as fins for a tri-gate non-planar FET, the dielectric caps present on the fins following formation (i.e., following fin etch) may subsequently be removed from the fins because tri-gate non-planar FETs must be devoid of such caps in order to provide three-dimensional field effects.

Also, optionally, as shown in FIG. 2, each of the fins 110a-c can further comprise a portion 114 of the semiconductor substrate 101 below the insulator section 110, regardless of whether the non-planar capacitor processing is integrated with dual-gate or tri-gate non-planar FET processing. Specifically, as discussed in greater detail below with regard to the method embodiments, during fin formation, etching can stop at the top surface 102 of the semiconductor substrate 101, as shown in FIG. 1. However, alternatively, etching can stop below the top surface 102 of the semiconductor substrate 101 such that each fin 110a-c further contains a portion 114 of the semiconductor substrate 101, which is below the insulator section 111 and which is positioned laterally between parallel trenches in the top surface 102 of the semiconductor substrate 101.

As shown in FIGS. 1-5, each of the embodiments of the non-planar capacitor 100 can further comprise a gate structure 140 that traverses the center portions 118 of the fins 110a-c.

This gate structure 140 can comprise a conformal dielectric layer 120, which functions as a dielectric plate. This conformal dielectric layer 120 can comprise, for example, a relatively thin silicon dioxide ($SiO_2$) layer, silicon nitride (SiN) layer, silicon oxynitride (SiON) layer, high-k dielectric layer, or any other dielectric layer suitable for use as a dielectric plate for a capacitor). This conformation dielectric layer 120 can conformally cover the center portions 118 the fins 110a-c (i.e., the top surface 115 and opposing sidewalls 116 of the center portion 118 of each of the fins 110a-c) as well as the sections 105 of the top surface 102 of the semiconductor substrate 101 adjacent to and extending between the center portions 118 of the fins 110a-c.

Additionally, as shown in FIGS. 1-2, the gate structure 140 can further comprise a conductor layer 130, which functions as a first capacitor plate. This conductor layer 130 can be positioned on the conformal dielectric layer 120 such that it traverses the center portions 118 of the fins 110a-c and, more particularly, such that it is on the conformal dielectric layer 120 opposite the top surface 115 and opposing sidewalls 116 of the center portion 118 of each fin and such that it is also on the conformal dielectric layer 120 opposite the sections 105 of the top surface 102 of the semiconductor substrate 101 adjacent to and extending between the center portions 118 of the fins 110a-c.

The gate structure 140 can be patterned and etched such that the end portions 117 of the each of the fins 110a-c extend laterally beyond the gate structure 140 (i.e., beyond the dielectric layer 120-conductor layer 130 stack).

It should be noted that in one of the embodiments as shown in FIG. 1, this conductor layer 130 can comprise a blanket conductor layer such that the spaces between the fins 110a-c and above the horizontal portions of the conformal dielectric layer 120 are filled with conductor material. This blanket conductor layer can comprise, for example, a blanket metal layer. As discussed in greater detail below with regard to the method embodiments a blanket metal layer can be deposited, for example, using an electroplating process. Metals that can be deposited in this manner to form a blanket conductor layer can include, but are not limited to, copper and aluminum.

Alternatively, this blanket conductor layer can comprise an additional semiconductor layer (e.g., a polycrystalline semiconductor layer, such as a polysilicon layer) that is doped with a relatively high concentration of N-type or P-type dopant so as to have a relatively high N-type or P-type conductivity level (i.e., N+ or P+ conductivity, respectively).

Alternatively, in another one of the embodiments as shown in FIG. 2, this conductor layer 130 can comprise a relatively thin conformal conductor layer. This conformal conductor layer can comprise, for example, a conformal metal layer. As discussed in greater detail below with regard to the method embodiments a thin conformal conductor layer can be deposited, for example, using an atomic layer chemical vapor deposition process, such that the conformal conductor layer has a thickness of 0.1-0.3 Å. Conductive metals or metal alloys that can be deposited in this manner to form a thin conformal conductor layer can include, but are not limited to, tungsten, tungsten nitride, titanium, titanium nitride, tantalum, tantalum nitride, etc.

As mentioned above, the end portions 117 of the fins 110a-c can extend laterally beyond the gate structure 140 and the end portions 117 of adjacent fins can be either electrically isolated from each other (see FIG. 3 and detailed discussion below).

Figure 3:
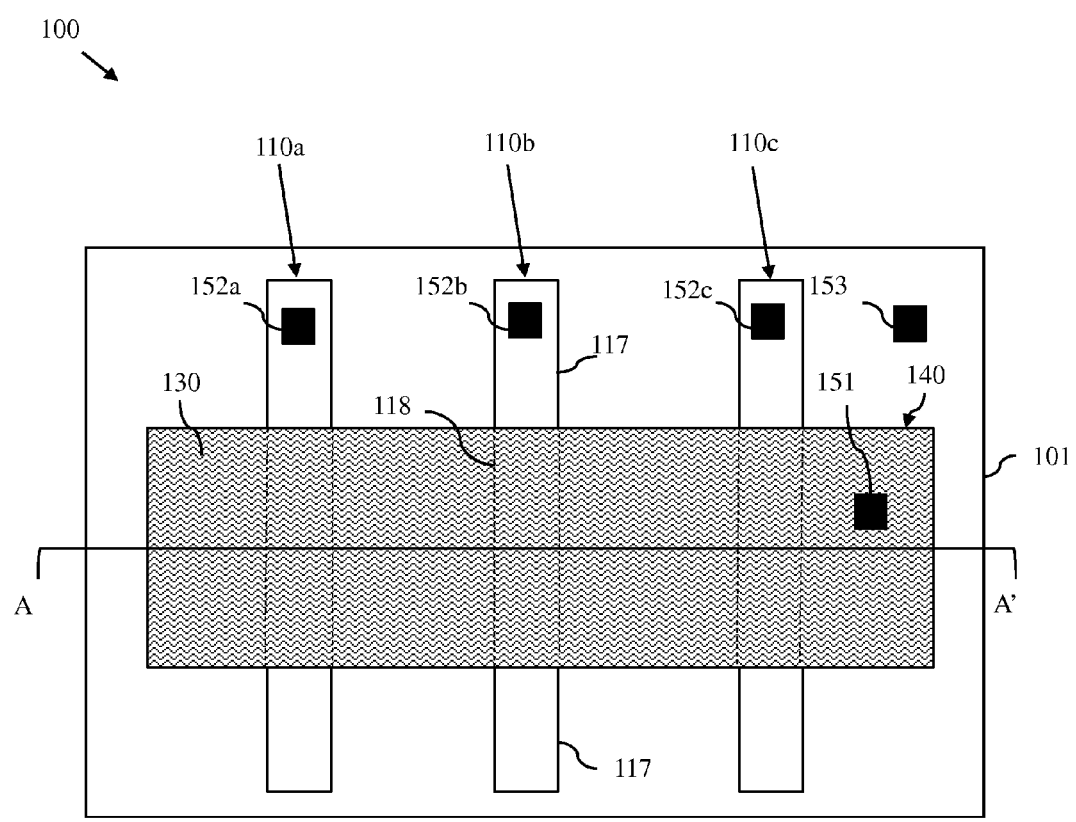
FIG. 3 is drawing illustrating a top view of an embodiment of a non-planar capacitor with multiple, electrically isolated, fins.

Specifically, as shown in FIG. 3, the fins 110a-c can comprise discrete structures and the semiconductor sections 112 in the end portions 117 of each of the fins 110-a-c can be electrically isolated from each other. One or more additional dielectric layers (i.e., one or more layers of interlayer dielectric materials, such as silicon dioxide ($SiO_2$), silicon nitride (SiN), borophosphosilicate glass (BPSG), etc.) can cover the non-planar capacitor 100. Contacts 151, 152a-c and 153 can extend vertically through the additional dielectric layer(s) to the conductor layer 130, to the end portions 117 of each of the fins 110a-c on one or both sides of the gate structure 140, and to the semiconductor substrate 101, respectively. It should be understood that if the fins 110a-c have dielectric caps 113 (as shown in FIG. 1), the contacts 152a-c should extend vertically through the dielectric caps 113 to the semiconductor sections 112 below. Thus, in the embodiment shown in FIG. 3, the non-planar capacitor 100 can exhibit a first capacitance between the conductor layer 130, which functions as a first conductive plate, and the semiconductor sections 112 of the fins 110a-c, which function as second conductive plates, and can further exhibit a second capacitance between the conductor layer 130 and the semiconductor substrate 101, which functions as a third conductive plate. Optionally, a multiplexor (not shown) can be connected between a voltage source and the contacts 152a-c so as to allow any one or more of the semiconductor sections 112 of the fins 110a-c to be biased at a given time and, thereby so that the first capacitance can be selectively tuned (i.e., selectively varied).

Alternatively, the non-planar capacitor 100 can comprise contact region(s) 170 (see FIG. 4) or 180 (see FIG. 5) that electrically connect the end portions 117 of the fins 110a-c on one or both sides of the gate structure 140. These contact region(s) 170 or 180 can be essentially perpendicular to and can abut the end portions 117 of the fins 110a-c.

Figure 4:
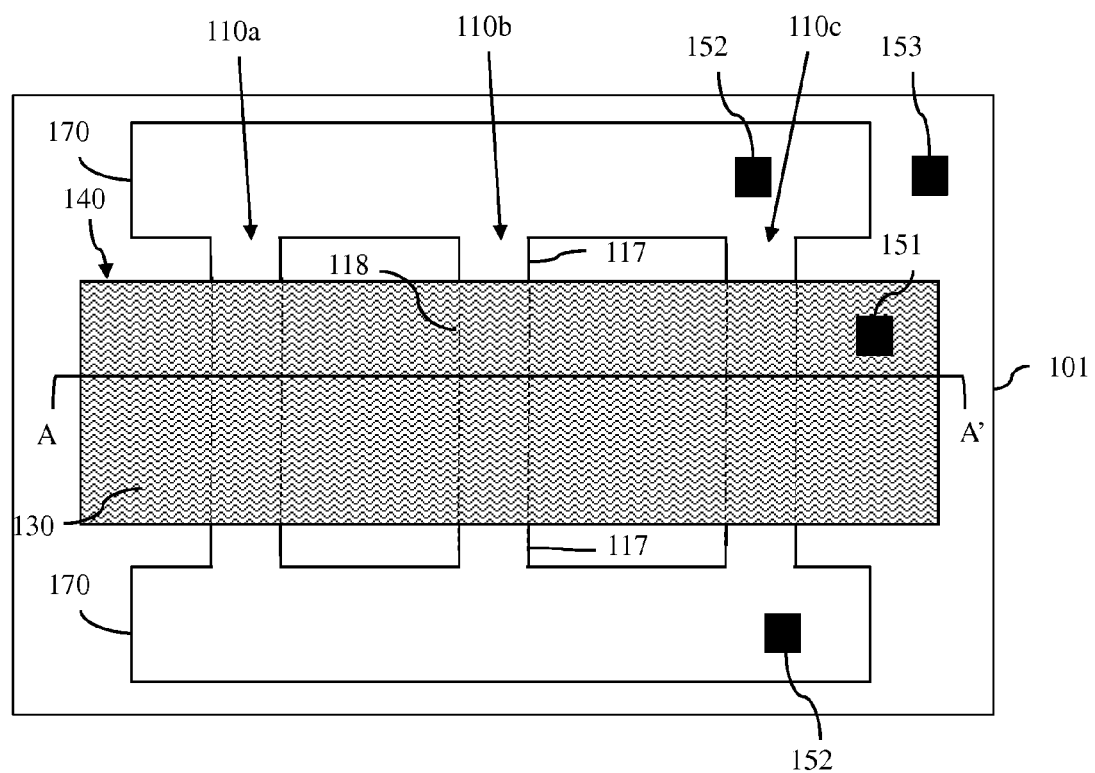
FIG. 4 is a drawing illustrating a top view of an embodiment of a non-planar capacitor with multiple fins extending laterally between contact regions.

In one embodiment, as shown in FIG. 4, the contact regions 170 and fins 110a-c can be patterned and etched into the SOI wafer at the same time so as to form a discrete essentially ladder-shaped structure similar to the essentially ladder-shaped structure formed during multi-fin MUGFET processing as shown in U.S. Pat. No. 7,888,750 of Anderson et al., issued on Feb. 15, 2011, assigned to International Business Machines Corporation and incorporated herein by reference. Thus, in this embodiment, the contacts regions 170 and fins 110a-c can comprise essentially the same material sections (i.e., an insulator section on the top surface of the semiconductor substrate, a semiconductor section above the insulator section and, optionally, a dielectric cap and/or a portion of the semiconductor substrate below the insulator section).

Figure 5:
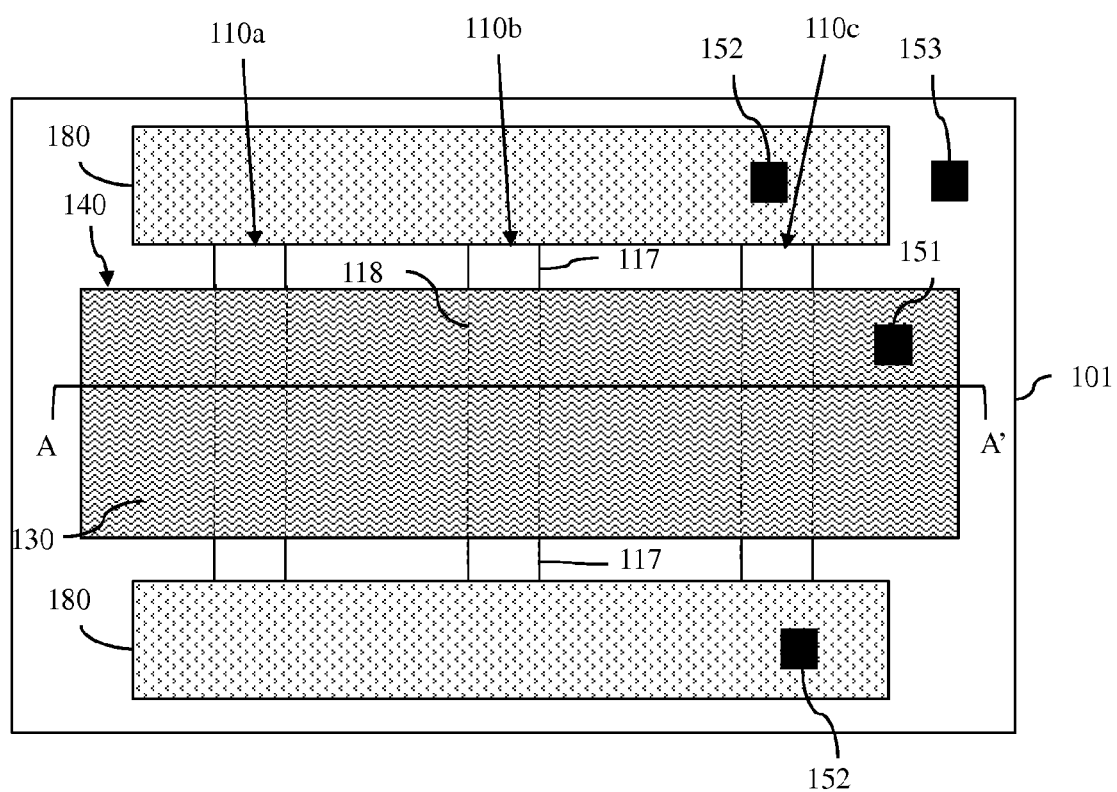
FIG. 5 is a drawing illustrating a top view of an embodiment of a non-planar capacitor with multiple, electrically connected, fins.

In other embodiments, as shown in FIG. 5, the contact region(s) 180 can comprise regions wherein the semiconductor sections 112 in the end portions 117 of the fins 110a-c on one or both sides of the gate structure 140 are electrically connected by additional conductive materials. For example, they can be electrically connected by a conductive strap (e.g., a metal strap) similar to that used to electrically connect fins during multi-fin MUGFET processing as illustrated in U.S. Pat. No. 7,851,283 of Anderson et al., issued on Dec. 14, 2010, assigned to International Business Machines Corporation and incorporated herein by reference. Alternatively, they can be electrically connected by epitaxial semiconductor material, which is grown on vertical surfaces of the semiconductor sections 112 in the end portions 117 of the fins 110a-c so as to merge the end portions 117 of the fins 110a-c, which is doped so as to have the same conductivity type as the semiconductor sections 112 of the fins 110a-c and, which is similar to that used to electrically connect fins during multi-fin MUGFET processing in U.S. patent application Ser. No. 13/359,615 of Bryant et al., filed on Jan. 27, 2012, assigned to International Business Machines Corporation and incorporated herein by reference.

In the case where contact region(s) 170 or 180 electrically connect the end portions 117 of the fins 110a-c on one or both sides of the gate structure 140, one or more additional dielectric layers (i.e., one or more layers of interlayer dielectric materials, such as silicon dioxide ($SiO_2$), silicon nitride (SiN), borophosphosilicate glass (BPSG), etc.) can similarly cover the non-planar capacitor 100 and contacts 151, 152 and 153 can extend vertically through the additional dielectric layer(s) to the conductor layer 130, to the contact region(s) 170 or 180 and to the semiconductor substrate 101, respectively. Thus, in the embodiment shown in FIGS. 4 and 5, the non-planar capacitor 100 can exhibit a first capacitance between the conductor layer 130, which functions as a first conductive plate, and the semiconductor sections 112 of the fins 110a-c, which in combination function as a second conductive plate, and can further exhibit a second capacitance between the conductor layer 130 and the semiconductor substrate 101, which functions as a third conductive plate. It should be understood that if the contact region(s) 170, like the fins 110a-c, have dielectric caps, the contacts 152 should extend vertically through the dielectric caps to the semiconductor sections below.

Also disclosed herein are method embodiments, which can be used to form such a non-planar capacitor 100 and which are compatible with current state of the art multi-gate non-planar field effect transistor (MUGFET) processing.

Figure 6:
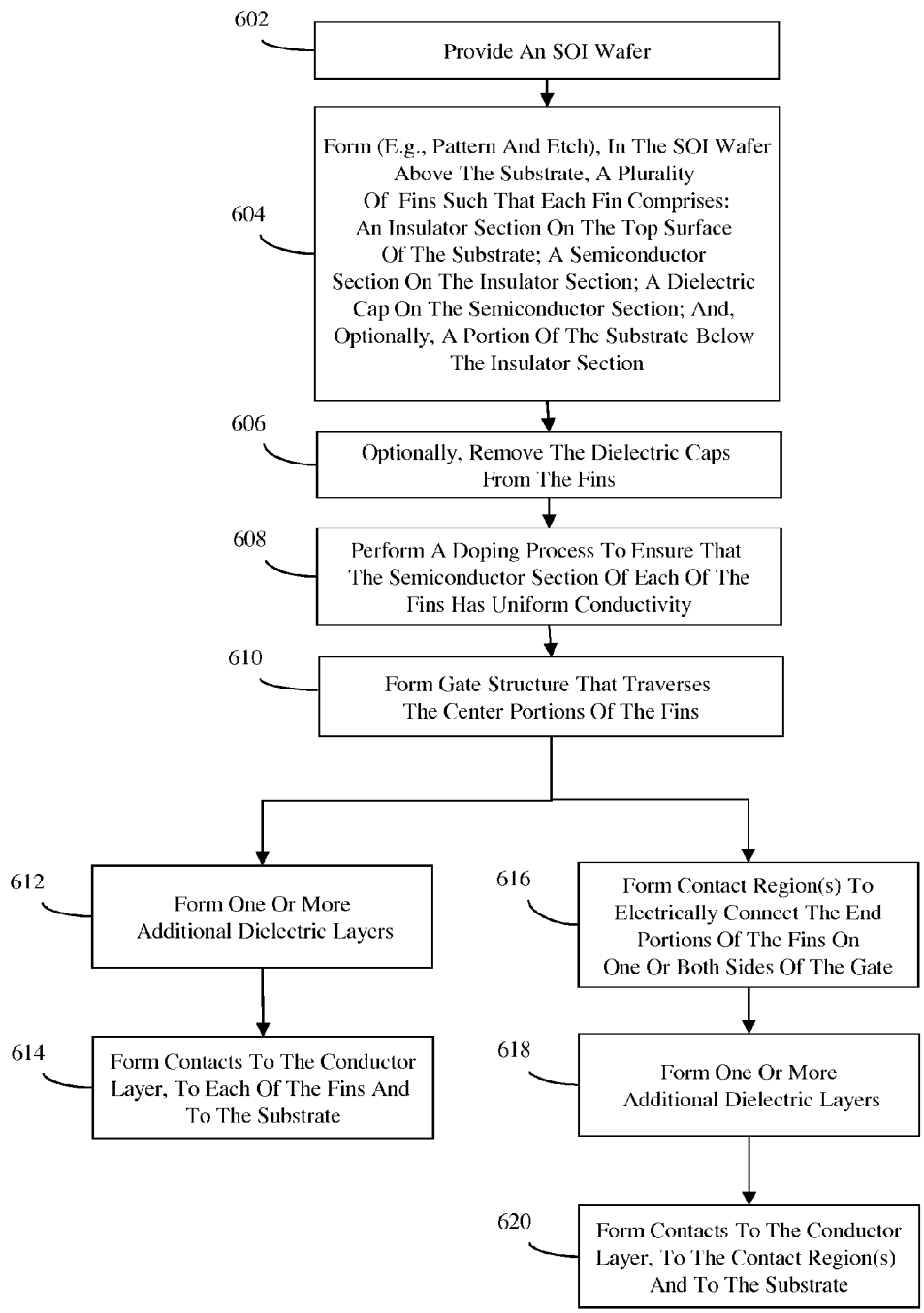
FIG. 6 is a flow diagram illustrating an embodiment of a method of forming a non-planar capacitor.
Figure 7:
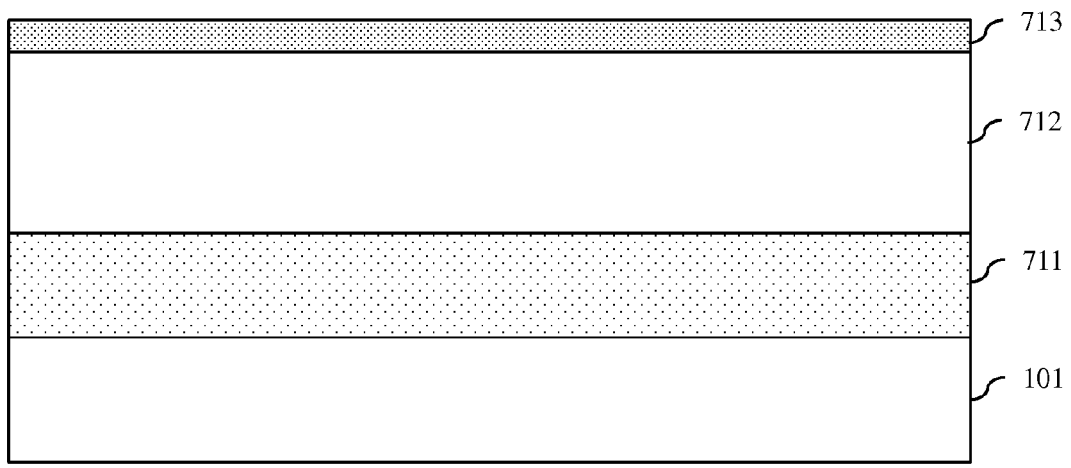
FIG. 7 is a drawing illustrating a cross-section of a partially completed non-planar capacitor.

Referring to FIG. 6, an embodiment of a method of forming a non-planar capacitor 100 can comprise providing a semiconductor-on-insulator (SOI) wafer (602, see FIG. 7). Specifically, the method can comprise providing a semiconductor-on-insulator (SOI) wafer that comprises, for example, a semiconductor substrate 101 (e.g., a silicon substrate or any other suitable semiconductor substrate); an insulator layer 711 (e.g., a silicon dioxide ($SiO_2$) layer, a sapphire layer or any other suitable insulator layer) on the top surface 102 of the semiconductor substrate 101 and a semiconductor layer 712 (e.g., a silicon layer, a gallium nitride layer, or any other suitable semiconductor layer) on the insulator layer 711. One or more additional dielectric layers 713 (e.g., a silicon nitride layer, a silicon oxide layer, a silicon oxynitride layer and/or any other suitable dielectric cap) can be formed on the semiconductor layer 712.

Next, a plurality of fins 110a-c can be formed above the semiconductor substrate 101 (604). For purposes of this disclosure, a fin refers to a relatively thin, vertically oriented, essentially rectangular, three-dimensional body. Additionally, for illustration purposes, three fins 110a-c are shown as being formed at process 604; however, it should be understood that any number of two or more fins can be formed. The fins 110a-c can be formed using well-known patterning (e.g., lithographic patterning and/or sidewall image transfer patterning) and etch techniques.

Figure 8:
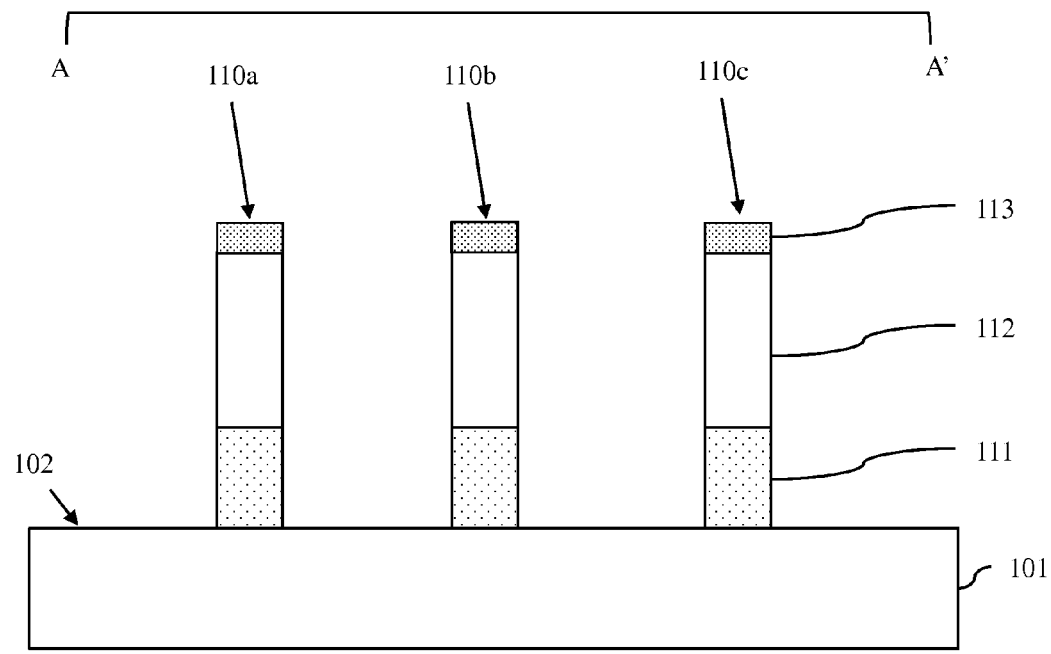
FIG. 8 is a drawing illustrating a cross-section of a partially completed non-planar capacitor.
Figure 9:
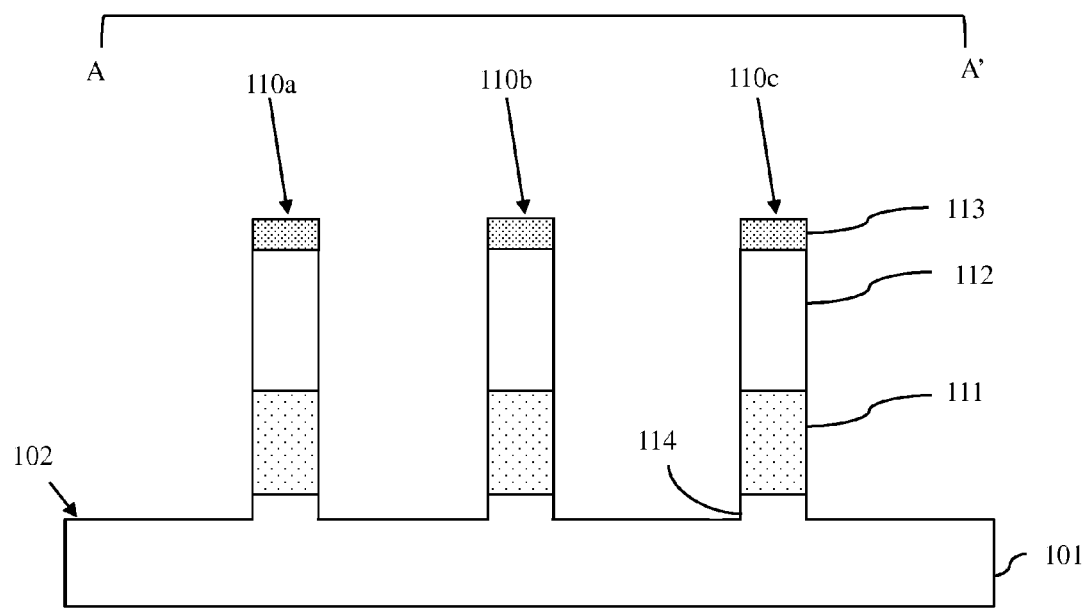
FIG. 9 is a drawing illustrating a cross-section of a partially completed non-planar capacitor.

Specifically, during fin formation at process 604, the fins can be patterned and then multiple etch steps can be performed to etch through the dielectric layer 713, the semiconductor layer 712 and the insulator layer 711 stopping at the top surface 102 of the semiconductor substrate 101 (as shown in FIG. 8) or, alternatively, stopping below the top surface 102 but before the bottom surface of the semiconductor substrate 101 (as shown in FIG. 9). Thus, as shown in FIG. 8, following fin formation at process 604, each of the fins 110a-c can comprise at least an insulator section 111 (i.e., a section of the insulator layer 711 of the SOI wafer) on the top surface 102 of the semiconductor substrate 101; a semiconductor section 112 (i.e., a section of the semiconductor layer 712 of the SOI wafer) stacked above the insulator section 111; and a dielectric cap 113 (i.e., a section of the dielectric layer 713) stacked above the semiconductor section 112. Optionally, as shown in FIG. 9, if etching stops below the top surface 102 of the semiconductor substrate 101, each fin 110a-c can further comprise a portion 114 of the semiconductor substrate 101, which is below the insulator section 111 and which is positioned laterally between parallel trenches in the top surface 102 of the semiconductor substrate 101.

Figure 10:
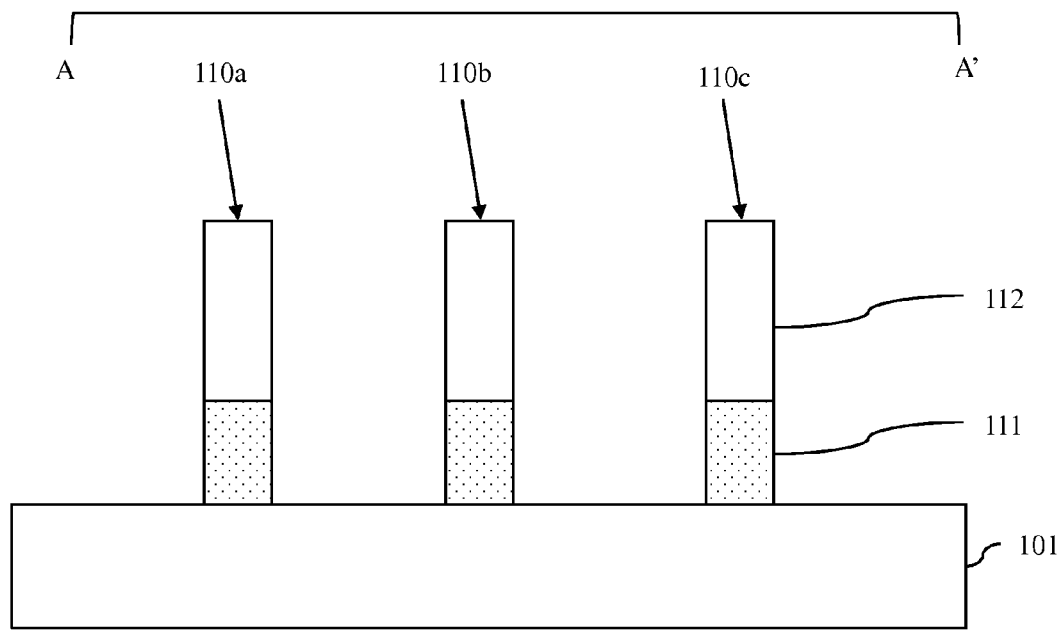
FIG. 10 is a drawing illustrating a cross-section of a partially completed non-planar capacitor.
Figure 11:
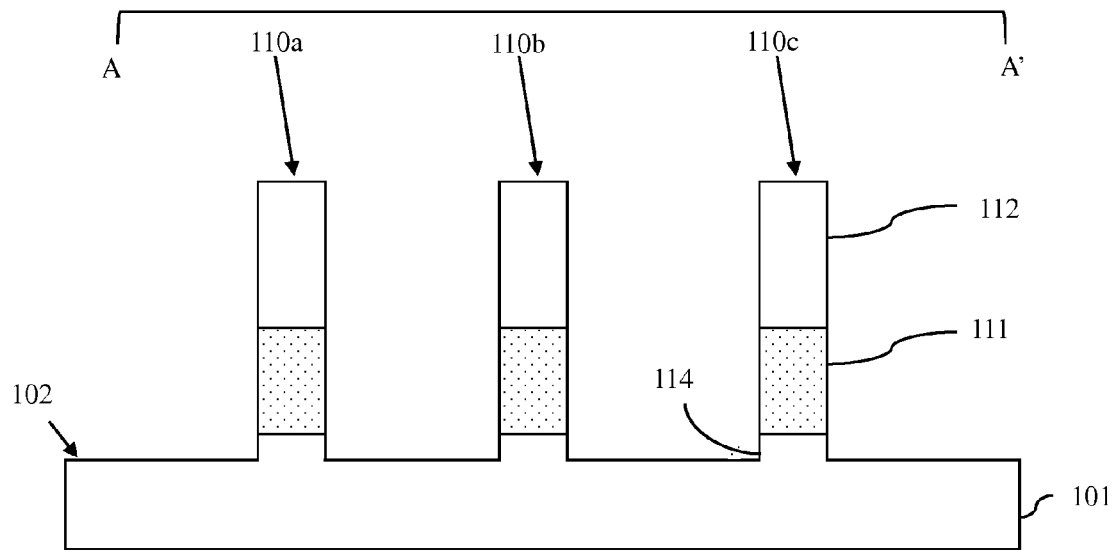
FIG. 11 is a drawing illustrating a cross-section of a partially completed non-planar capacitor.
Figure 12:
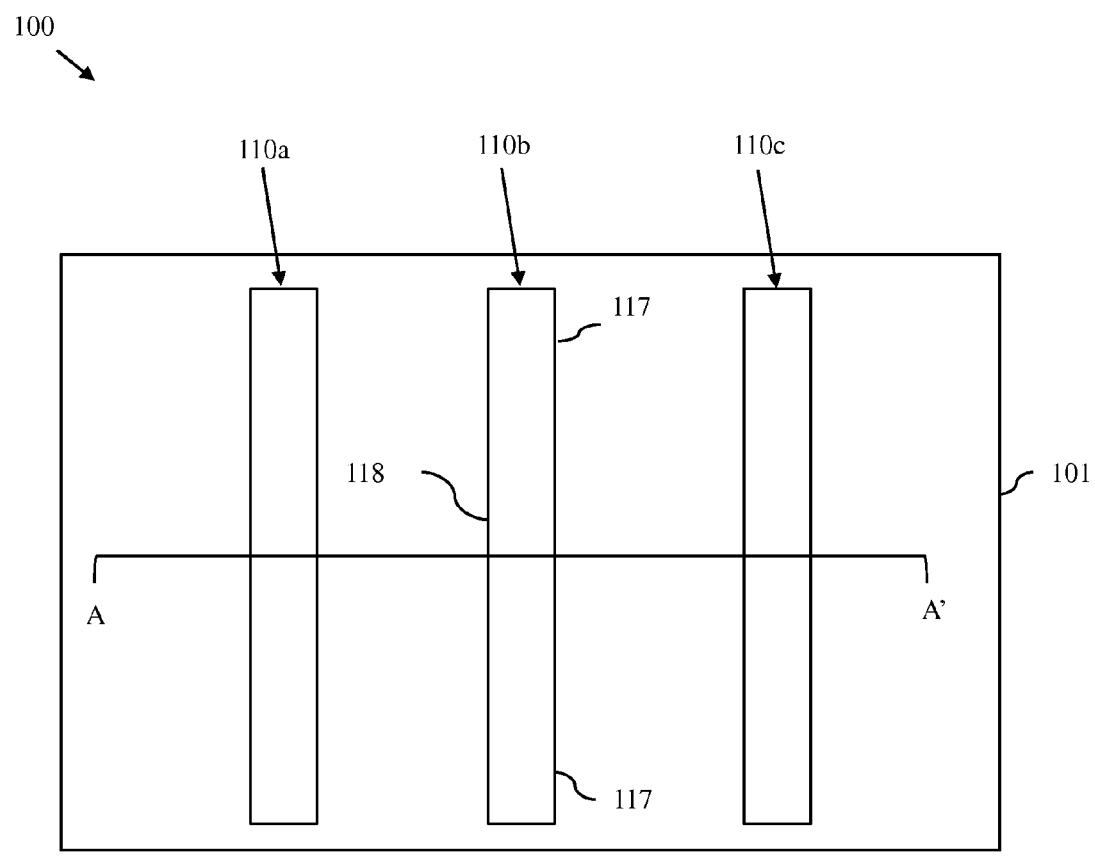
FIG. 12 is a drawing illustrating a top view of a partially completed non-planar capacitor.

It should be noted that, if non-planar capacitor processing is integrated with MUGFET processing and, more specifically, if the fins 110a-c for the non-planar capacitor 100 are formed at essentially the same time as the fins for a MUGFET, the MUGFET fin etch will typically stop at the insulator layer 711 and the MUGFET fins will be masked as the insulator layer 711 and, if applicable, the semiconductor substrate 101 are etched for the capacitor fins. Additionally, it should be noted that, if non-planar capacitor processing is integrated with dual-gate non-planar FET processing, the dielectric caps 113 may be left intact on all fins following formation at process 604 because dual-gate non-planar FETs require such caps in order to limit the field effect so only two-dimensional field effects. However, as shown in FIGS. 10 and 11, if the non-planar capacitor processing is integrated with tri-gate non-planar FET processing, the dielectric caps 113 may subsequently be removed (606) because tri-gate non-planar FETs must be devoid of such caps in order to provide three-dimensional field effects. In any case, following process 604 and, if applicable, process 606, each of the fins 110a-c will comprise discrete structures having a center portion 118 positioned laterally between end portions 117 (see FIG. 12).

Additionally, a doping process (e.g., a dopant implantation process) can be performed in order to ensure that the semiconductor section 112 of each of the fins 110a-c has essentially uniform conductivity (608). That is, a doping process can be performed such that the semiconductor section 112 of each fin 110a-c has the same conductivity type (e.g., N-type or P-type) and approximately the same conductivity level across its length, width and height.

Those skilled in the art will recognize that different dopants can be used to achieve the desired conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having an N-type conductivity is typically doped with silicon (Si). Furthermore, those skilled in the art will recognize that this doping process can be performed either before or after the fins 110a-c are formed at process 604.

Next, a gate structure can be formed that traverses the center portions 118 of the fins 110a-c (610). It should be noted that, if non-planar capacitor processing is integrated with MUGFET process, formation of the capacitor gate structure at process 610 can be performed essentially simultaneously with MUGFET gate structure formation. For illustration purposes, FIGS. 13-15 discussed below show a gate structure being formed at process 610 on fins 110a-c, such as those shown in FIG. 8, which comprise an insulator section 111, a semiconductor section 112, and a dielectric cap 113, but not a portion of the semiconductor substrate. However, it should be understood that the same gate structure can alternatively be formed on fins 110a-c that are devoid of dielectric caps and/or that comprise a portion 1114 of the semiconductor substrate (e.g., as shown in FIGS. 9-11).

At process 610, a conformal dielectric layer 120 can be formed (e.g., by chemical vapor deposition or other suitable technique) over the fins 110a-c. This dielectric layer 120 can comprise, for example, a relatively thin silicon dioxide ($SiO_2$) layer, silicon nitride (SiN) layer, silicon oxynitride (SiON) layer, high-k dielectric layer, or any other dielectric layer suitable for use as a dielectric plate for a capacitor). Then, conductor layer 130 can be formed on the dielectric layer 120 (see FIGS. 13 and 14).

Figure 13:
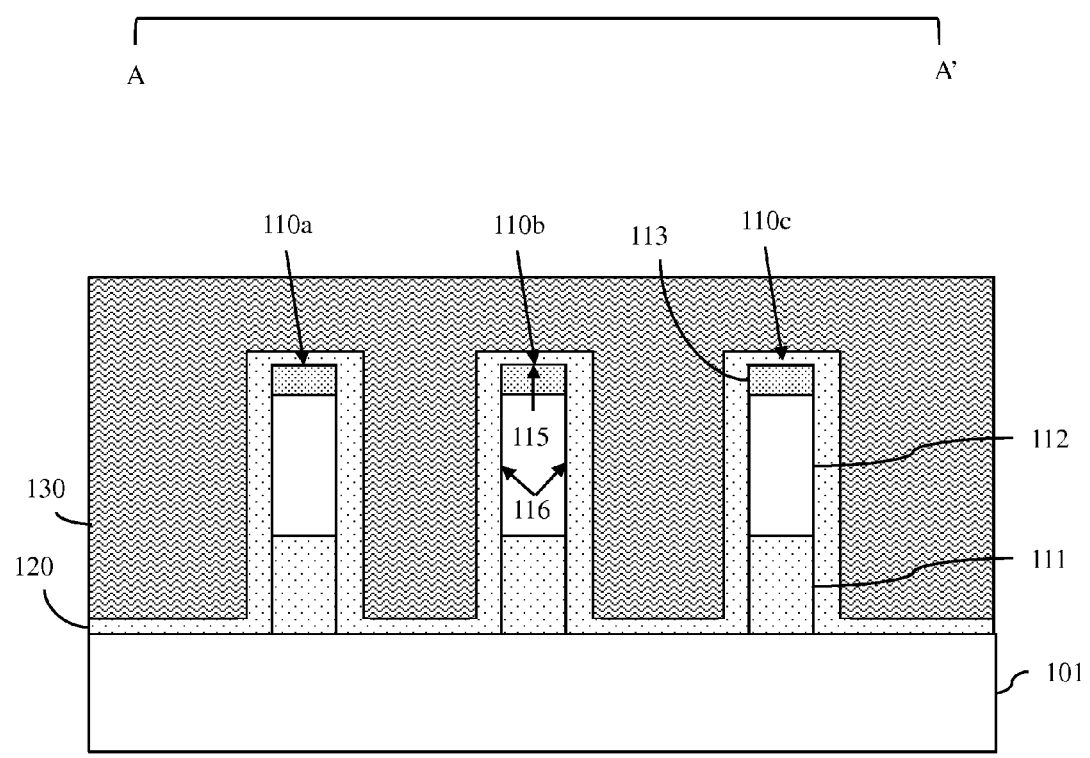
FIG. 13 is a drawing illustrating a cross-section of a partially completed non-planar capacitor.

Specifically, in one embodiment, as shown in FIG. 13, a blanket conductor layer can be formed over the dielectric layer 120 such that the spaces between the fins 110a-c and above the horizontal sections of the conformal dielectric layer 120 are filled with conductor material. This blanket conductor layer can comprise a blanket metal layer deposited, for example, using a conventional electroplating process. Metals that can be deposited in this manner can include, but are not limited to, copper and aluminum. Alternatively, this blanket conductor layer can comprise an additional semiconductor layer (e.g., a polycrystalline semiconductor layer, such as a polysilicon layer) deposited, for example, by chemical vapor deposition and doped (e.g., either in situ or subsequently) with a relatively high concentration of N-type or P-type dopant so as to have a relatively high N-type or P-type conductivity level (i.e., N+ or P+ conductivity, respectively).

Figure 14:
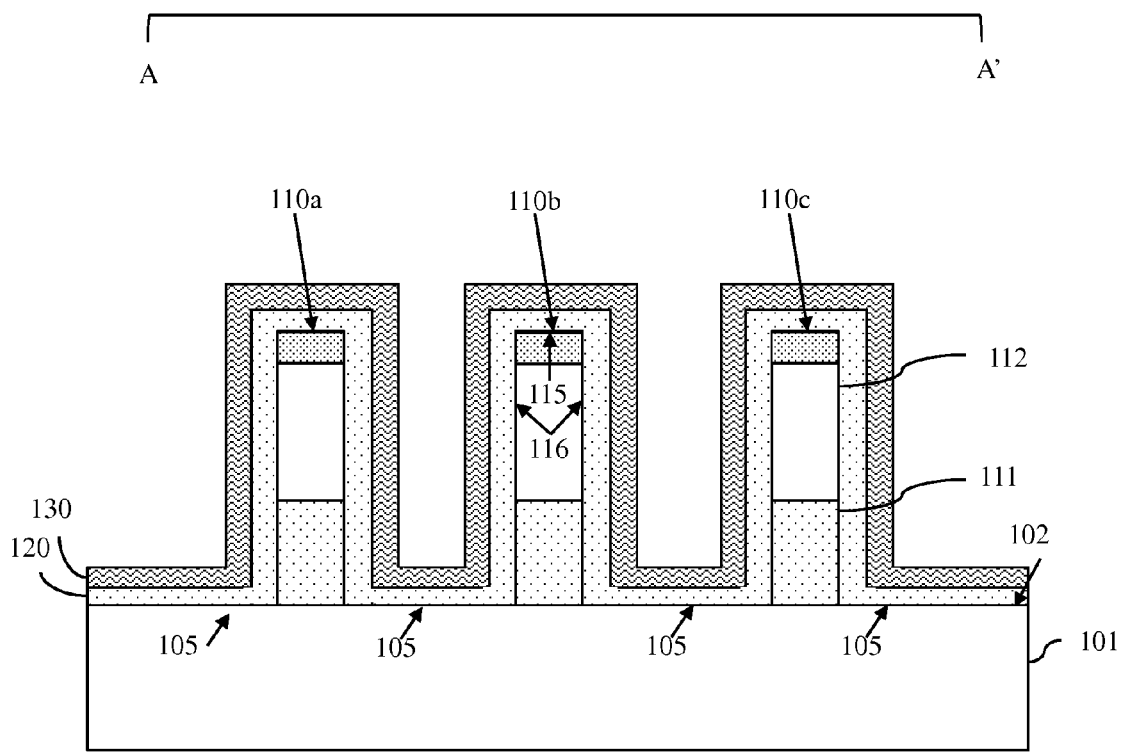
FIG. 14 is a drawing illustrating a cross-section of a partially completed non-planar capacitor.

In another embodiment, as shown in FIG. 14, this conductor layer 130 can comprise a relatively thin conformal conductor layer. This conformal conductor layer can comprise a conformal metal layer deposited, for example, using an atomic layer chemical vapor deposition process, such that the conformal conductor layer has a thickness of 0.1-0.3 Å. Conductive metals or metal alloys that can be deposited in this manner to form a thin conformal conductor layer can include, but are not limited to, tungsten, tungsten nitride, titanium, titanium nitride, tantalum, tantalum nitride, etc.

It should be noted that techniques for depositing blanket and conformal conductive layers, as described above, are well-known in the art and, thus, the details are omitted from this specification to allow the reader to focus on the salient aspects of the embodiments.

Figure 15:
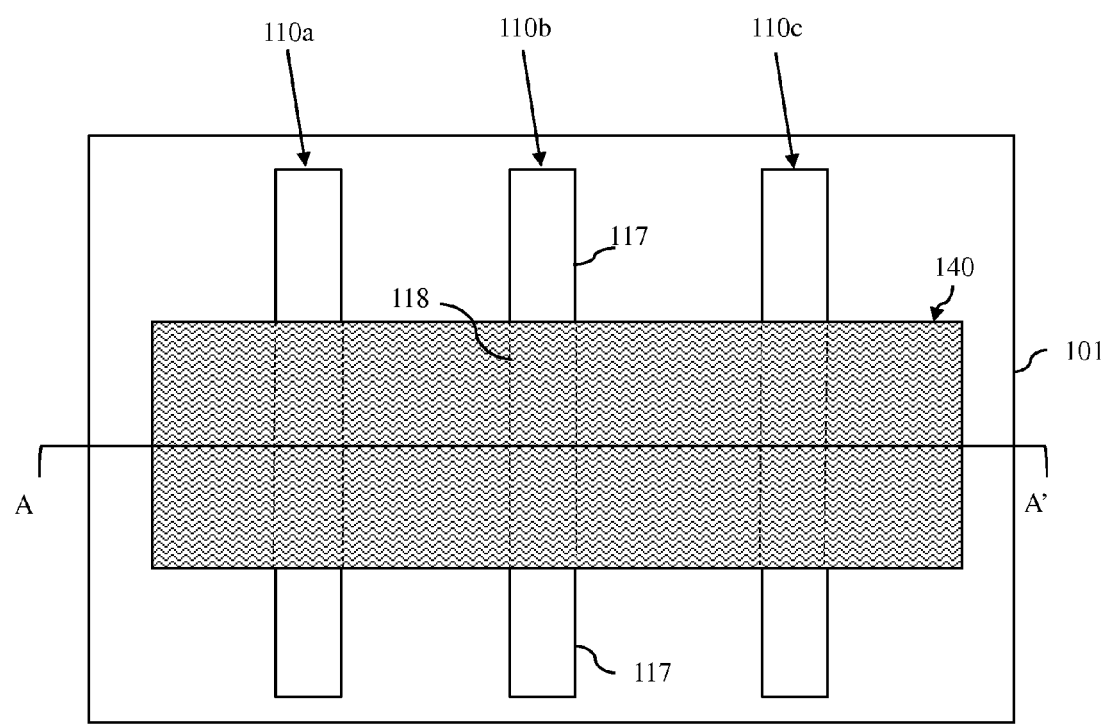
FIG. 15 is a drawing illustrating a top view of a partially completed non-planar capacitor.

After the conformal dielectric layer 120 and conductor layer 130 are deposited, the resulting dielectric layer-conductor layer stack can be lithographically patterned and etched so as to form the gate structure 140 that traverses the center portions 118 of the fins 110a-c and so as to expose the end portions 117 of the fins (see FIG. 15). Thus, following gate structure formation at process 610, the end portions 117 of the fins 110a-c will extend laterally beyond the gate structure 140. It should be noted that, if present, dielectric caps 113 can be removed from the exposed end portions 117 of the fins 110a-c during the gate etch.

Those skilled in the art will recognize that following gate structure formation, typical multi-fin MUGFET processing involves the formation of dielectric spacers on the gate sidewalls, the formation of metal silicide layers on the exposed end portions of the fins and the formation of source/drain dopant implantation regions within the exposed end portions of the MUGFET fins. Thus, when the non-planar capacitor processing is integrated with multi-fin MUGFET processing, dielectric spacers (not shown) can similarly be formed on the gate structure 140 and metal silicide layers (not shown) can similarly be formed on exposed semiconductor surfaces in the end portions 117 of the fins 110a-c. However, it should be understood that masking steps may be required to ensure that, during MUGFET source/drain dopant implantation, the semiconductor sections 112 of the non-planar capacitor 100 retain their essentially uniform conductivity.

Next, in one embodiment, one or more additional dielectric layers (i.e., one or more layers of interlayer dielectric materials, such as silicon dioxide ($SiO_2$), silicon nitride (SiN), borophosphosilicate glass (BPSG), etc.) can be deposited (612) and contacts 152a-c can be formed that extend vertically through the additional dielectric layers to the conductor layer 130, to the end portions 117 of the fins 110a-c (or, more particularly, to the semiconductor sections 112 thereof), and to the semiconductor substrate 101, respectively (614, see FIG. 3). Thus, in this embodiment, the resulting non-planar capacitor 100 as shown in FIG. 3 can exhibit a first capacitance between the conductor layer 130, which functions as a first conductive plate, and the fins 110a-c (or, more particularly, the semiconductor sections 112 thereof), which function as second conductive plates, and can further exhibit a second capacitance between the conductor layer 130 and the semiconductor substrate 101, which functions as a third conductive plate. Optionally, a multiplexor can be electrically connected between a voltage source and the contacts 152a-c to the end portions 117 of the fins 110a-c so as to allow any one or more of the semiconductor sections 112 of the fins 110a-c to be biased at a given time and, thereby so that the first capacitance can be selectively tuned or varied.

Figure 16:
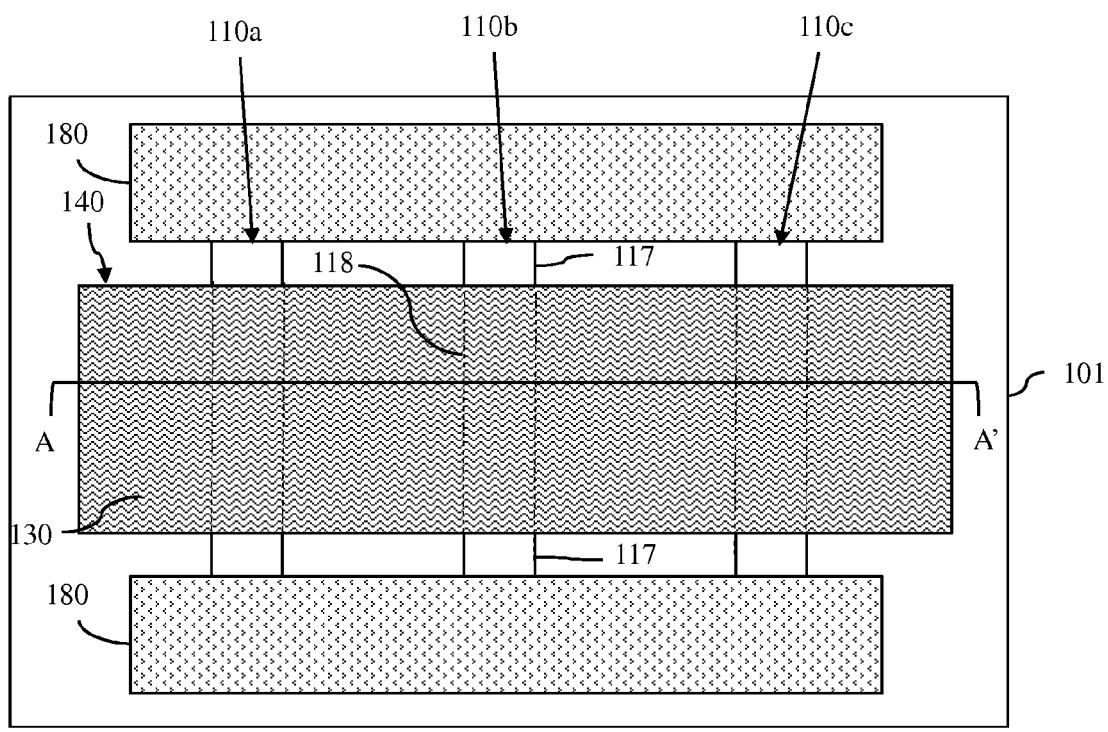
FIG. 16 is a drawing illustrating a top view of a partially completed non-planar capacitor.

Alternatively, in other embodiments, after the end portions 117 of the fins 110a-c are exposed, contact region(s) 180 can be formed to electrically connect the end portions 117 of the fins 110a-c on one or both sides of the gate structure 140 (616, see FIG. 16). Such contact region(s) 180 can be formed by forming conductive strap(s), which traverse the end portions 117 of the fins 110a-c (e.g., see the conductive straps used to electrically connect fins during multi-fin MUGFET processing as shown in U.S. Pat. No. 7,851,283 of Anderson et al., incorporated by reference above). Alternatively, such contact region(s) 180 can be formed (e.g., as illustrated in U.S. patent application Ser. No. 13/359,615 of Bryant et al., incorporated herein by reference above) by growing epitaxial semiconductor material on vertical surfaces of the semiconductor sections 112 in the end portions 117 of the fins 110a-c so as to merge the end portions 117 of the fins 110a-c. The epitaxial semiconductor material can be either in-situ doped or subsequently doped so as to have the same conductivity type as the semiconductor sections 112 of the fins 110a-c. In these embodiment, one or more additional dielectric layers (i.e., one or more layers of interlayer dielectric materials, such as silicon dioxide ($SiO_2$), silicon nitride (SiN), borophosphosilicate glass (BPSG), etc.) can similarly be deposited (618) and contacts 151, 152 and 153 can be formed that extend vertically through the additional dielectric layer(s) to the conductor layer 130, to the contact region(s) 180 and to the semiconductor substrate 101, respectively (620, see FIG. 5). Thus, in these embodiments, the resulting non-planar capacitor 100 as shown in FIG. 5 can exhibit a first capacitance between the conductor layer 130, which functions as a first conductive plate, and the semiconductor sections 112 of the fins 110a-c, which in combination function as a second conductive plate, and can further exhibit a second capacitance between the conductor layer 130 and the semiconductor substrate 101, which functions as a third conductive plate.

Figure 17:
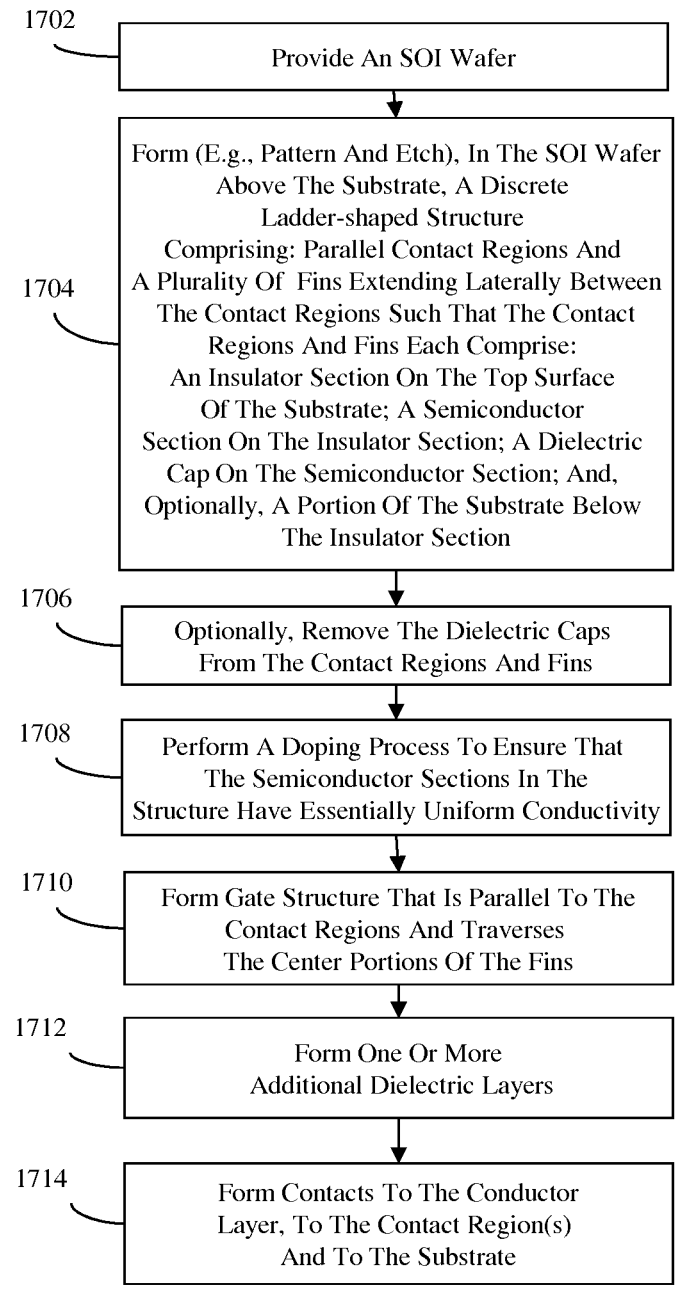
FIG. 17 is a flow diagram illustrating another embodiment of a method of forming a non-planar capacitor.

Referring to FIG. 17, another embodiment of a method of forming a non-planar capacitor 100 can comprise providing a semiconductor-on-insulator (SOI) wafer such as that described in detail above and illustrated in FIG. 7 (1702). However, in this embodiment, rather than forming discrete fins in the SOI wafer above the semiconductor substrate 101, an essentially ladder-shaped structure similar in shape to the essentially ladder-shaped structure formed during multi-fin MUGFET processing as shown in U.S. Pat. No. 7,888,750 of Anderson et al., incorporated by reference above (1704).

Figure 18:
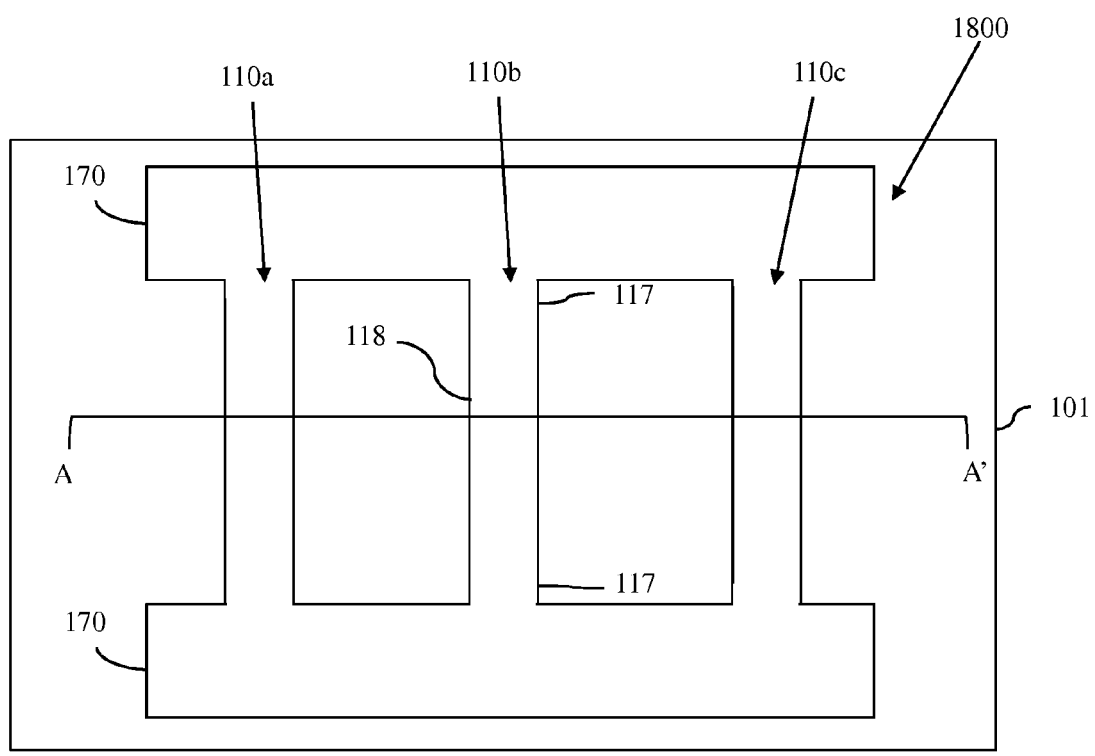
FIG. 18 is a drawing illustrating a top view of a partially completed non-planar capacitor.

Specifically, as shown in the top view diagram of FIG. 18, this discrete ladder-shaped structure 1800 can be patterned and etched such that it comprises parallel contact regions 170 and a plurality of fins 110a-c extending laterally between the contact regions 170. For purposes of this embodiment, the contact regions and fins are vertically oriented, essentially rectangular, three-dimensional bodies. Additionally, for illustration purposes, three fins 110a-c are shown in FIG. 18 as being formed at process 1704; however, it should be understood that any number of two or more fins can be formed.

As in process 604 described in detail above, during structure 1800 formation at process 1704, the contact regions and fins can be patterned and then multiple etch steps can be performed so as to etch through the dielectric layer 713, the semiconductor layer 712 and the insulator layer 711 stopping at the top surface 102 of the semiconductor substrate 101 (e.g., as shown in FIG. 8) or, alternatively, stopping below the top surface 102 of the semiconductor substrate 101 (as shown in the FIG. 9). Thus, following structure 1800 formation at process 1604, each of the fins 110a-c, as well as the contact regions 170 (not shown), can comprise at least an insulator section 111 (i.e., a section of the insulator layer 711 of the SOI wafer) on the top surface 102 of the semiconductor substrate 101; a semiconductor section 112 (i.e., a section of the semiconductor layer 712 of the SOI wafer) stacked above the insulator section 111; and a dielectric cap 113 (i.e., a section of the dielectric layer 613) stacked above the semiconductor section 112 (see FIG. 7). Optionally, as shown in FIG. 9, if etching stops below the top surface 102 of the semiconductor substrate 101, each of the fins 110a-c, as well as the contact regions 170 (not shown), will further comprise a portion 114 of the semiconductor substrate 101, which is below the insulator section 111 and which is positioned laterally between parallel trenches in the top surface 102 of the semiconductor substrate 101.

It should be noted that, if non-planar capacitor processing is integrated with MUGFET processing and, more specifically, if the essentially ladder-shaped structure 1800 for the non-planar capacitor 100 are formed at essentially the same time as an essentially ladder-shaped structure for a MUGFET, etching for the MUGFET will typically stop at the insulator layer 711 and the MUGFET ladder-shaped structure will be masked as the insulator layer 711 and, if applicable, the semiconductor substrate 101 are etched for the capacitor ladder-shaped structure 1800. Additionally, it should be noted that, if non-planar capacitor processing is integrated with dual-gate non-planar FET processing, the dielectric caps 113 may be left intact because dual-gate non-planar FETs require such caps in order to limit the field effect so only two-dimensional field effects. However, if the non-planar capacitor processing is integrated with tri-gate non-planar FET processing, the dielectric caps 113 may subsequently be removed (1706) because tri-gate non-planar FETs must be devoid of such caps in order to provide three-dimensional field effects. In any case, following process 1704 and, if applicable, process 1706, each of the fins 110a-c will extend laterally between contact regions 170 and will have a center portion 118 positioned laterally between end portions 117 (see FIG. 18).

Additionally, a doping process (e.g., a dopant implantation process) can be performed in order to ensure that the semiconductor sections 112 of the contact regions 170 and fins 110a-c have essentially uniform conductivity (1708). That is, a doping process can be performed such that the semiconductor sections 112 of the contact regions 170 and fins 110a-c have the same conductivity type (e.g., N-type or P-type) and approximately the same conductivity level. As mentioned above, those skilled in the art will recognize that different dopants can be used to achieve the desired conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having an N-type conductivity is typically doped with silicon (Si). Furthermore, those skilled in the art will recognize that this doping process can be performed either before or after the ladder-shaped structure is formed at process 1704.

Next, a gate structure can be formed that is essentially parallel to the contact regions 170 and that traverses the center portions 118 of the fins 110a-c (1710). It should be noted that, if non-planar capacitor processing is integrated with MUGFET process, formation of the capacitor gate structure at process 1710 can be performed essentially simultaneously with MUGFET gate structure formation. The gate structure can be performed in essentially the same manner as described above with respect to process 610 of FIG. 6.

Specifically, a conformal dielectric layer 120 can be formed (e.g., by chemical vapor deposition or other suitable technique) over the essentially ladder-shaped structure 1800. This dielectric layer 120 can comprise, for example, a relatively thin silicon dioxide ($SiO_2$) layer, silicon nitride (SiN) layer, silicon oxynitride (SiON) layer, high-k dielectric layer, or any other dielectric layer suitable for use as a dielectric plate for a capacitor). Then, conductor layer 130 can be formed on the dielectric layer 120 (see FIGS. 13 and 14). In one embodiment, as shown in FIG. 13, a blanket conductor layer can be formed over the dielectric layer 120 such that the spaces between the fins 110a-c and above the horizontal sections of the conformal dielectric layer 120 are filled with conductor material. This blanket conductor layer can comprise a blanket metal layer deposited, for example, using a conventional electroplating process. Metals that can be deposited in this manner can include, but are not limited to, copper and aluminum. Alternatively, this blanket conductor layer can comprise an additional semiconductor layer (e.g., a polycrystalline semiconductor layer, such as a polysilicon layer) deposited, for example, by chemical vapor deposition and doped (e.g., either in situ or subsequently) with a relatively high concentration of N-type or P-type dopant so as to have a relatively high N-type or P-type conductivity level (i.e., N+ or P+ conductivity, respectively). In another embodiment, as shown in FIG. 14, this conductor layer 130 can comprise a relatively thin conformal conductor layer. This conformal conductor layer can comprise a conformal metal layer deposited, for example, using an atomic layer chemical vapor deposition process, such that the conformal conductor layer has a thickness of 0.1-0.3 Å. Conductive metals or metal alloys that can be deposited in this manner to form a thin conformal conductor layer can include, but are not limited to, tungsten, tungsten nitride, titanium, titanium nitride, tantalum, tantalum nitride, etc. Again, it should be noted that techniques for depositing blanket and conformal conductive layers, as described above, are well-known in the art and, thus, the details are omitted from this specification to allow the reader to focus on the salient aspects of the embodiments.

Figure 19:
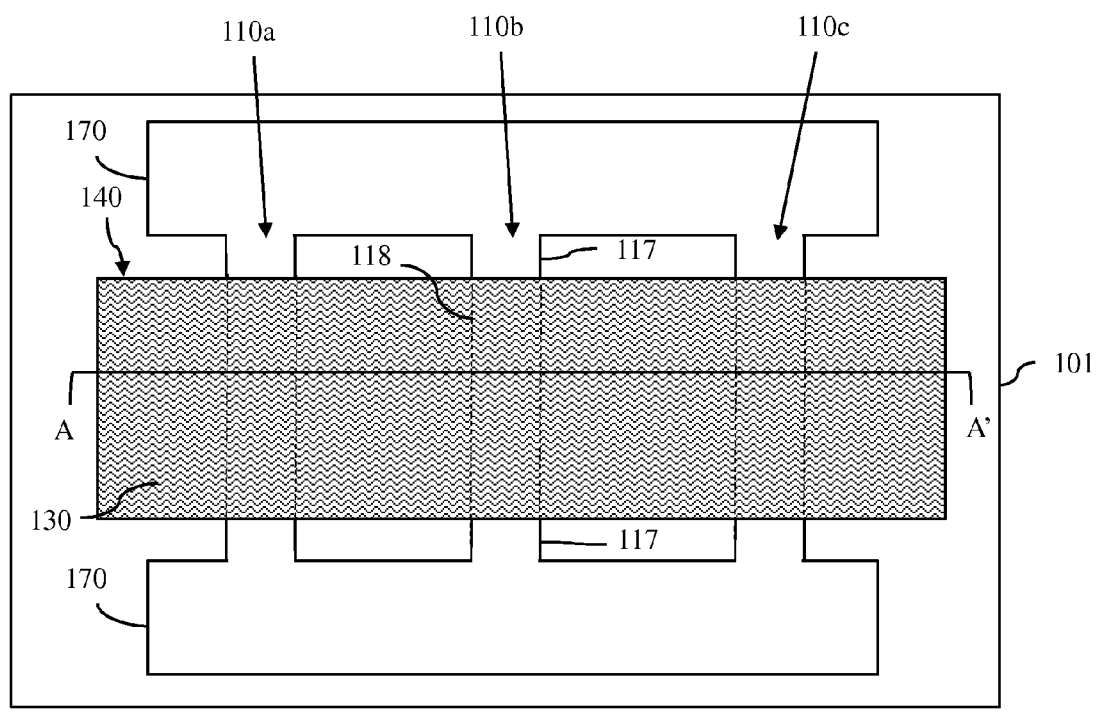
FIG. 19 is a drawing illustrating a top view of a partially completed non-planar capacitor.

After the conformal dielectric layer 120 and conductor layer 130 are deposited, the resulting dielectric layer-conductor layer stack can be lithographically patterned and etched so as to form the gate structure 140 that traverses the center portions 118 of the fins 110a-c and so as to expose the contact regions 170 (see FIG. 19). It should be noted that, if present, dielectric caps 113 can be removed from the exposed portions of the structure 1800 during the gate etch.

Those skilled in the art will recognize that following gate structure formation, typical multi-fin MUGFET processing involves the formation of dielectric spacers on the gate sidewalls, the formation of metal silicide layers on the exposed portions of the MUGFET ladder-shaped structure and the formation of source/drain dopant implantation regions within the exposed portions of the MUGET ladder-shaped structure. Thus, when the non-planar capacitor processing is integrated with multi-fin MUGFET processing, dielectric spacers (not shown) can similarly be formed on the gate structure 140 and metal silicide layers (not shown) can similarly be formed on exposed semiconductor surfaces in the contact regions 170. However, it should be understood that masking steps may be required to ensure that, during MUGFET source/drain dopant implantation, the semiconductor sections 112 of the non-planar capacitor 100 retain their essentially uniform conductivity.

After the conformal dielectric layer 120 and conductor layer 130 are deposited, the resulting dielectric layer-conductor layer stack can be lithographically patterned and etched so as to expose the contact regions 170 and so as to form the gate structure 140 that is essentially parallel to the contact regions 170 and that traverses the center portions 118 of the fins 110a-c (see FIG. 19). It should be noted that, if present, dielectric caps 113 can be removed from the exposed portions of the ladder-shaped structure 1800 during the gate etch.

Those skilled in the art will recognize that following gate structure formation, typical multi-fin MUGFET processing involves the formation of dielectric spacers on the gate sidewalls, the formation of metal silicide layers and the formation of source/drain dopant implantation regions. Thus, when the non-planar capacitor processing is integrated with multi-fin MUGFET processing, dielectric spacers (not shown) can be formed on the gate structure 140 and metal silicide layers (not shown) can e formed on the contact regions 170. However, it should be understood that masking steps may be required to ensure that, during MUGFET source/drain dopant implantation, the semiconductor sections 112 of the non-planar capacitor 100 retain their essentially uniform conductivity.

Next, one or more additional dielectric layers (i.e., one or more layers of interlayer dielectric materials, such as silicon dioxide ($SiO_2$), silicon nitride (SiN), borophosphosilicate glass (BPSG), etc.) can be deposited (1712) and contacts 151, 152 and 153 can be formed that extend vertically through the additional dielectric layer(s) to the conductor layer 130, to the contact region(s) 170 and to the semiconductor substrate 101, respectively (1714, see FIG. 4). Thus, in this embodiment, the resulting non-planar capacitor 100 as shown in FIG. 4 can exhibit a first capacitance between the conductor layer 130, which functions as a first conductive plate, and the semiconductor sections 112 of the fins 110a-c, which in combination function as a second conductive plate, and can further exhibit a second capacitance between the conductor layer 130 and the semiconductor substrate 101, which functions as a third conductive plate.

It should be understood that the terminology used herein is for the purpose of describing particular embodiments only and is not intended to be limiting of the embodiments. As used herein, the singular forms "a", "an" and "the" are intended to include the plural forms as well, unless the context clearly indicates otherwise. It should further be understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. In addition, it should be understood that terms such as "right", "left", "vertical", "horizontal", "top", "bottom", "upper", "lower", "under", "below", "underlying", "over", "overlying", "parallel", "perpendicular", etc., used herein are relative locations as they are oriented and illustrated in the drawings (unless otherwise indicated). Furthermore, terms such as "touching", "on", "in direct contact", "abutting", "directly adjacent to", "immediately adjacent to", etc., are intended to mean that at least one element physically contacts another element (without other elements separating the described elements).

It should further be understood that the method embodiments, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Finally, it should be understood that the corresponding structures, materials, acts, and equivalents of all means or step plus function elements in the claims below are intended to include any structure, material, or act for performing the function in combination with other claimed elements as specifically claimed. The above description of the embodiments is presented for purposes of illustration and is not intended to be exhaustive or limiting. Many modifications and variations to the disclosed embodiments will be apparent to those of ordinary skill in the art without departing from the scope and spirit of the disclosed embodiments.

Therefore, disclosed above are embodiments of a non-planar capacitor. This non-planar capacitor can comprise a plurality of fins above a semiconductor substrate. Each fin can comprise at least an insulator section on the semiconductor substrate and a semiconductor section, which has essentially uniform conductivity, stacked above the insulator section. A gate structure can traverse the center portions of the fins. This gate structure can comprise a conformal dielectric layer and a conductor layer (e.g., a blanket or conformal conductor layer) on the dielectric layer. Such a non-planar capacitor can exhibit a first capacitance, which is optionally tunable, between the conductor layer and the fins and a second capacitance between the conductor layer and the semiconductor substrate. Also disclosed herein are method embodiments, which can be used to form such a non-planar capacitor and which are compatible with current state of the art multi-gate non-planar field effect transistor (MUGFET) processing.

What is claimed is:

1. A capacitor comprising:
   a semiconductor substrate having a top surface;
   a plurality of fins on said top surface of said semiconductor substrate, each of said fins comprising:
      an insulator section on said top surface of said semiconductor substrate; and
      a semiconductor section above said insulator section, said semiconductor section having essentially uniform conductivity;
   a conformal dielectric layer on said fins and said top surface of said semiconductor substrate adjacent to and between said fins, said top surface of said semiconductor substrate being essentially planar such that bottom surfaces of each insulator section of each fin on said top surface of said semiconductor substrate are essentially coplanar with adjacent bottom surfaces of portions of said conformal dielectric layer on said top surface of said semiconductor substrate adjacent to and between said fins; and
   a conductor layer on said dielectric layer.

2. The capacitor of claim 1, said conductor layer comprising a blanket conductor layer.

3. The capacitor of claim 1, said conductor layer comprising a conformal conductor layer.

4. The capacitor of claim 1, said fins each further comprising a dielectric cap above said semiconductor section.

5. The capacitor of claim 1, said uniform conductivity of said semiconductor section being any one of N-type and P-type conductivity across a length, width and height of said semiconductor section.

6. The capacitor of claim 1, said fins comprising end portions extending laterally beyond said dielectric layer and said conductor layer and said capacitor further comprising contacts connected to said conductor layer, to said end portions, and to said semiconductor substrate such that said capacitor can exhibit a tunable first capacitance between said conductor layer and said fins and a second capacitance between said conductor layer and said semiconductor substrate.

7. The capacitor of claim 1, said fins comprising end portions extending laterally beyond said dielectric layer and said conductor layer and said capacitor further comprising:
   a contact region electrically connecting said end portions; and
   contacts connected to said conductor layer, to said contact region, and to said semiconductor substrate such that said capacitor can exhibit a first capacitance between said conductor layer and said fins and a second capacitance between said conductor layer and said semiconductor substrate.

8. A capacitor comprising:
   a plurality of fins above a top surface of a semiconductor substrate, each of said fins comprising:
      an insulator section on a top surface of said semiconductor substrate;
      a semiconductor section above said insulator section, said semiconductor section having essentially uniform conductivity; and
      a dielectric cap on said semiconductor section, said fins having opposing sidewalls comprising vertically aligned sidewalls of said insulator section, said semiconductor section and said dielectric cap;
   a conformal dielectric layer covering said fins such that said conformal dielectric layer is immediately adjacent to said vertically aligned sidewalls of said insulator section, said semiconductor section and said dielectric cap, said conformal dielectric layer further covering said top surface of said semiconductor substrate adjacent to and between said fins, said top surface of said semiconductor substrate being essentially planar such that bottom surfaces of each insulator section of each fin on said top surface of said semiconductor substrate are essentially coplanar with adjacent bottom surfaces of portions of said conformal dielectric layer on said top surface of said semiconductor substrate adjacent to and between said fins; and
   a conductor layer on said dielectric layer.

9. The capacitor of claim 8, said conductor layer comprising a blanket conductor layer.

10. The capacitor of claim 8, said conductor layer comprising a conformal conductor layer.

11. The capacitor of claim 8, said uniform conductivity of said semiconductor section being any one of N-type and P-type conductivity across a length, width and height of said semiconductor section.

12. The capacitor of claim 8, said fins comprising end portions extending laterally beyond said dielectric layer and said conductor layer and said capacitor further comprising contacts connected to said conductor layer, to said end portions, and to said semiconductor substrate such that said capacitor can exhibit a tunable first capacitance between said conductor layer and said fins and a second capacitance between said conductor layer and said semiconductor substrate.

13. The capacitor of claim 8, said fins comprising end portions extending laterally beyond said dielectric layer and said conductor layer and said capacitor further comprising:
   a contact region electrically connecting said end portions; and
   contacts connected to said conductor layer, to said contact region, and to said semiconductor substrate such that said capacitor can exhibit a first capacitance between said conductor layer and said fins and a second capacitance between said conductor layer and said semiconductor substrate.

14. A capacitor comprising:
 a plurality of fins above a top surface of a semiconductor substrate, each of said fins comprising:
  an insulator section on a top surface of said semiconductor substrate; and
  a semiconductor section above said insulator section, said semiconductor section having essentially uniform conductivity;
 a conformal dielectric layer on said fins and said top surface of said semiconductor substrate adjacent to and between said fins; and
 a conformal conductor layer on said dielectric layer, said conformal conductor layer having a thickness of 0.1-0.3 angstroms.

15. The capacitor of claim 14, said conductor layer comprising a blanket conductor layer.

16. The capacitor of claim 14, said fins each further comprising a dielectric cap above said semiconductor section.

17. The capacitor of claim 14, said uniform conductivity of said semiconductor section being any one of N-type and P-type conductivity across a length, width and height of said semiconductor section.

18. The capacitor of claim 14, said fins comprising end portions extending laterally beyond said dielectric layer and said conductor layer and said capacitor further comprising contacts connected to said conductor layer, to said end portions, and to said semiconductor substrate such that said capacitor can exhibit a tunable first capacitance between said conductor layer and said fins and a second capacitance between said conductor layer and said semiconductor substrate.

19. The capacitor of claim 14, said fins comprising end portions extending laterally beyond said dielectric layer and said conductor layer and said capacitor further comprising:
 a contact region electrically connecting said end portions; and
 contacts connected to said conductor layer, to said contact region, and to said semiconductor substrate such that said capacitor can exhibit a first capacitance between said conductor layer and said fins and a second capacitance between said conductor layer and said semiconductor substrate.

* * * * *